(12) United States Patent
Govil et al.

(10) Patent No.: US 9,923,004 B2
(45) Date of Patent: Mar. 20, 2018

(54) HARDWARE ACCELERATION OF COMPUTER VISION FEATURE DETECTION

(71) Applicant: QUALCOMM Incorporated, San Diego, CA (US)

(72) Inventors: Alok Govil, Fremont, CA (US); Soo Youn Kim, San Diego, CA (US); Evgeni Petrovich Gousev, Saratoga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/862,314

(22) Filed: Sep. 23, 2015

(65) Prior Publication Data

US 2016/0091947 A1    Mar. 31, 2016

Related U.S. Application Data

(60) Provisional application No. 62/057,808, filed on Sep. 30, 2014.

(51) Int. Cl.
*H01L 27/146* (2006.01)
*H04N 5/232* (2006.01)
(Continued)

(52) U.S. Cl.
CPC .......... *H01L 27/1461* (2013.01); *G06F 3/017* (2013.01); *G06F 3/0425* (2013.01);
(Continued)

(58) Field of Classification Search
CPC .... H04N 5/378; H04N 5/2324; G06F 1/3203; G06K 9/00986; G06K 9/4619; G06K 9/605; H01L 27/1461; H01L 27/14643
(Continued)

(56) References Cited

U.S. PATENT DOCUMENTS 5,543,590 A    8/1996    Gillespie et al.
6,011,257 A    1/2000    Endoh
(Continued)

FOREIGN PATENT DOCUMENTS

CN    102663409 A    9/2012
DE    102006023611 A1    11/2007
(Continued)

OTHER PUBLICATIONS

Suarez M., et al., "CMOS-3D Smart Imager Architectures for Feature Detection", IEEE Journal on Emerging and Selected Topics in Circuits and Systems, IEEE, Piscataway, NJ, USA, vol. 2, No. 4, Dec. 1, 2012 (Dec. 1, 2012), pp. 723-736, XP011479510, ISSN: 2156-3357, DOI: 10.1109/JETCAS.2012.2223552.
(Continued)

*Primary Examiner* — Nhan T Tran
(74) *Attorney, Agent, or Firm* — Kilpatrick Townsend & Stockton, LLP

(57) ABSTRACT

Techniques describe apparatus and method for generating local binary pattern (LBP) labels based on sensor readings from sensor elements. The sensor apparatus may include a sensor element array that includes a plurality of sensor elements and may also include in-pixel circuitry coupled directly to the sensor element, peripheral circuitry coupled to the sensor element array and configured to receive output from one or more of sensor elements and digital circuitry. The in-pixel circuitry and/or peripheral circuitry may include an analog and/or digital computation structure configured to generate an LBP label for each of the sensor elements readings, by currently comparing the sensor readings for the referenced sensor element with the sensor readings of four or less neighboring sensor elements, and using previously, or subsequently, generated comparisons for the remaining neighboring sensor elements.

30 Claims, 20 Drawing Sheets

(51) Int. Cl.
*G06K 9/00* (2006.01)
*G06F 3/01* (2006.01)
*G06F 3/042* (2006.01)
*G06K 9/46* (2006.01)

(52) U.S. Cl.
CPC .... *G06K 9/00986* (2013.01); *H01L 27/14643* (2013.01); *H04N 5/23241* (2013.01); *G06K 2009/4666* (2013.01)

(58) Field of Classification Search
USPC ........................................ 348/294, 308, 310
See application file for complete search history.

(56) References Cited

U.S. PATENT DOCUMENTS

| | | | |
|---|---|---|---|
| 7,038,185 | B1 | 5/2006 | Tumblin et al. |
| 7,151,844 | B2 | 12/2006 | Stevenson et al. |
| 8,462,996 | B2 | 6/2013 | Moon et al. |
| 8,902,971 | B2 | 12/2014 | Pace et al. |
| 8,928,793 | B2 | 1/2015 | McMahon |
| 9,275,300 | B2 * | 3/2016 | Jiang ................. G06K 9/4638 |
| 2001/0028405 | A1 | 10/2001 | Kondo et al. |
| 2004/0155175 | A1 | 8/2004 | McNulty |
| 2009/0020612 | A1 | 1/2009 | Drzymala et al. |
| 2009/0157707 | A1 | 6/2009 | Ito et al. |
| 2010/0182468 | A1 | 7/2010 | Posch et al. |
| 2011/0128428 | A1 | 6/2011 | Takatoku et al. |
| 2011/0298755 | A1 | 12/2011 | Ni |
| 2012/0138774 | A1 | 6/2012 | Kelly et al. |
| 2012/0243742 | A1 * | 9/2012 | Sato ................. G06K 9/00288 382/103 |
| 2012/0313960 | A1 | 12/2012 | Segawa et al. |
| 2013/0054505 | A1 | 2/2013 | Ross et al. |
| 2013/0121590 | A1 | 5/2013 | Yamanaka et al. |
| 2013/0142426 | A1 * | 6/2013 | Kaneda ............... G06K 9/4642 382/165 |
| 2013/0176552 | A1 | 7/2013 | Brown et al. |
| 2014/0003663 | A1 | 1/2014 | Li et al. |
| 2014/0118592 | A1 * | 5/2014 | Yoon ...................... H04N 5/378 348/308 |
| 2014/0125799 | A1 | 5/2014 | Bos et al. |
| 2014/0149754 | A1 | 5/2014 | Silva et al. |
| 2014/0169663 | A1 | 6/2014 | Han et al. |
| 2014/0204238 | A1 * | 7/2014 | Cao ........................ H04N 5/232 348/222.1 |
| 2014/0212044 | A1 * | 7/2014 | Savvides .............. G06K 9/4609 382/190 |
| 2014/0286527 | A1 | 9/2014 | Harthattu et al. |
| 2014/0314271 | A1 * | 10/2014 | Xu ..................... G06K 9/00369 382/103 |
| 2014/0319325 | A1 | 10/2014 | Kawahito et al. |
| 2014/0320666 | A1 | 10/2014 | Badawy et al. |
| 2014/0355893 | A1 * | 12/2014 | Sankaran ............. G06K 9/4604 382/224 |
| 2014/0363049 | A1 | 12/2014 | Benosman et al. |
| 2014/0368423 | A1 | 12/2014 | Brenckle et al. |
| 2014/0368626 | A1 | 12/2014 | John et al. |
| 2014/0368712 | A1 | 12/2014 | Park et al. |
| 2015/0036942 | A1 | 2/2015 | Smirnov et al. |
| 2016/0091946 | A1 | 3/2016 | Govil et al. |
| 2016/0094800 | A1 | 3/2016 | Gousev |
| 2017/0064211 | A1 | 3/2017 | Omid-Zohoor |

FOREIGN PATENT DOCUMENTS

| | | |
|---|---|---|
| DE | 102008052930 A1 | 4/2010 |
| EP | 2709066 A1 | 3/2014 |
| JP | 2008131407 A | 6/2008 |
| JP | 2013003787 A | 1/2013 |
| WO | WO-2012093381 A1 | 7/2012 |
| WO | WO-2014015194 A2 | 1/2014 |

OTHER PUBLICATIONS

International Search Report and Written Opinion—PCT/US2015/052069—ISAEPO—dated Jan. 18, 2016.
Lahdenoja, O., et al., "Extracting Local Binary Patterns with MIPA4k Vision Processor," 12th International Workshop on Cellular Nanoscale Networks and their Applications (CNNA), Feb. 3, 2010, 5 pages.
Topi, M., et al., "Robust Texture Classification by Subsets of Local Binary Patterns," 15th International Conference on Pattern Recognition: Barcelona, Sep. 3-7, 2000, 4 pages.
Trein, J. et al., "Development of a FPGA Based Real-Time Blob Analysis Circuit", ISSC 2007, Derry, Sep. 13-14 (6 pages).
Delbruck, T., et al., "Activity-Driven, Event-Based Vision Sensors," Proceedings of 2010 IEEE International Symposium on Circuits and Systems (ISCAS), 2010, 4 pages.
Etienne-Cummings, R., et al., "A Programmable Focal-Plane MIMD Image Processor Chip", IEEE Journal of Solid-State Circuits, Jan. 2001, vol. 36, No. 1, pp. 64-73.
Hsiao, P.Y., et al., "A Novel CMOS Imager with 2-Dimensional Binarization and Edge Detection for Highly Integrated Imaging Systems," Digest of Technical Papers. International Conference on Consumer Electronics, 2006, pp. 71-72.
Lahdenoja, O., et al., "A Massively Parallel Algorithm for Local Binary Pattern based Face Recognition", IEEE, ISCAS 2006, pp. 3730-3733.
Laiho, M., et al., "Dedicated Hardware for Parallel Extraction of Local Binary Pattern Feature Vectors", 2005 9th International Workshop on Cellular Neural Networks and Their Applications, IEEE, May 2005, pp. 27-30.
Pierzchala, E., et al., "High Speed Field Programmable Analog Array Architecture Design", Analogix Corporation, Feb. 1994, 61 pages.
Poikonen, J., et al., "MIPA4k: A 64×64 Cell Mixed-mode Image Processor Array", ISCAS 2009, IEEE, May 24, 2009, pp. 1927-1930.
Posch, C., et al., "An Asynchronous Time-Based Image Sensor," IEEE International Symposium on Circuits and Systems (ISCAS), 2008, 4 pages.
QUALCOMM, "FAST Corners", Sep. 15, 2015, 6 Slides (153289 IDF).
Shi, Y., et al., "Smart Cameras: Fundamentals and Classification," Chapter 2, A.N. Belbachir (Ed.), Springer Science+Business Media, LLC 2010, pp. 19-34.
Stack Overflow, "FAST Detector in every levels on Gaussian Pyramids", matlab, Retrieved from internet, URL:http://stackoverflow.com/questions/24222611/fast-detector-in-every-levels-on-gaussian-pyramids , on Sep. 11, 2015, 2 Pages.
Wikipedia, "Features from accelerated segment test", Retrieved from Internet, URL: https://en.wikipedia.org/wiki/Features_from_accelerated_segment_test#High-speed_test , on Sep. 11, 2015, 6 Pages.
Wyatt, J.L., et al., "The MIT Vision Chip Project: Analog VLSI Systems for Fast Image Acquisition and Early Vision Processing," IEEE International Conference on Robotics and Automation, 1991, vol. 2, pp. 1330-1335.
Yu, H, "FAST Corner detection—Machine Learning for high speed corner detection", Nov. 16, 2010, 60 Slides.

* cited by examiner

SAMPLE

DIFFERENCE

THRESHOLD

SPOT

EDGE

SPOT/FLAT

CORNER

LINE END

HARDWARE ACCELERATION OF COMPUTER VISION FEATURE DETECTION

CROSS REFERENCE SECTION

This application is a non-provisional application and claims the benefit and priority of U.S. Provisional Application No. 62/057,808, filed on Sep. 30, 2014, titled "HARDWARE ACCELERATION OF LOCAL BINARY PATTERNS FOR COMPUTER VISION," which is herein incorporated by reference in its entirety for all purposes.

BACKGROUND

The present disclosure generally relates to enabling computer vision, and more specifically, improving efficiency for detecting features using computer vision.

Computer vision is a field that includes methods for acquiring, processing, analyzing, and understanding images for use in applications. Traditionally, a processor coupled to a sensor, acquires image data from a sensor and performs certain computer vision (CV) operations on the information received from sensor for detecting features and consequently objects associated with those features. Features may include features such as edges, corners, etc. These features may be used in determining macro features with more complex human features, such as faces, smiles and gestures. Programs executing on the processor may utilize the detected features in a variety of applications, such as plane-detection, face-detection, smile detection, gesture detection, etc.

Much effort has been made in recent years to enable computing devices to detect features and objects in the field of view of the computing device. Computing devices, such as mobile devices, are designed with sensitivity towards the amount of processing resources and power used by the mobile device and heat dissipation. However, traditionally, detecting features and objects in the field of view of the computing device, using a camera, requires significant processing resources resulting in higher power consumption and lower battery life in computing devices, such as mobile devices.

BRIEF DESCRIPTION OF THE DRAWINGS

Aspects of the disclosure are illustrated by way of example. The following description is provided with reference to the drawings, where like reference numerals are used to refer to like elements throughout. While various details of one or more techniques are described herein, other techniques are also possible. In some instances, well-known structures and devices are shown in block diagram form in order to facilitate describing various techniques.

A further understanding of the nature and advantages of examples provided by the disclosure may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, the reference numeral refers to all such similar components.

FIGS. 11A, 11B, 11C, 11D, 11E, 11F, 11G and 11H illustrates an example process for generating the LBP label for any given sensor by only performing four comparisons.

SUMMARY

Figure 1:
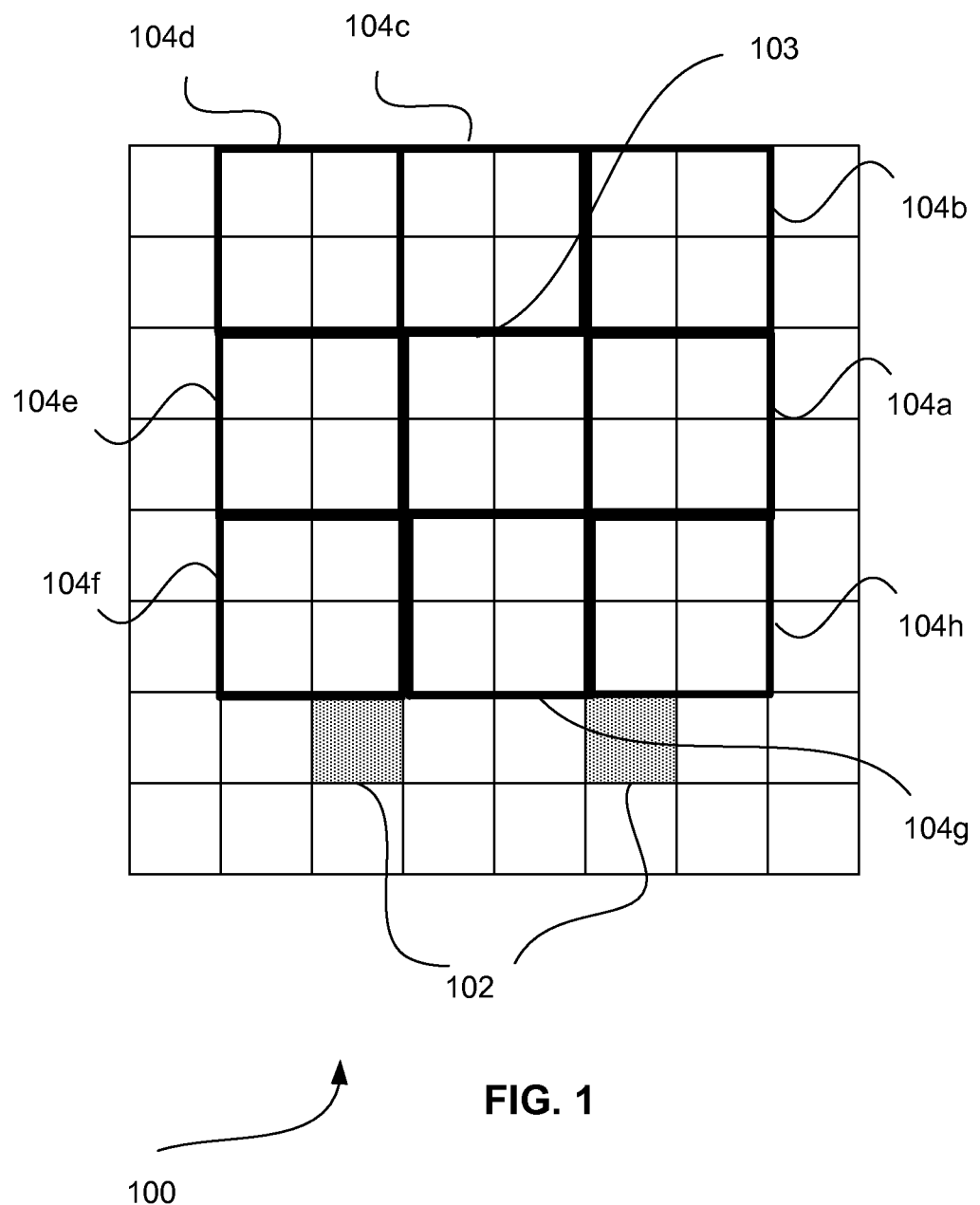
FIG. 1 illustrates an example sensor comprising a plurality of sensor elements arranged in a 2-dimensional array.

The present disclosure generally relates to enabling computer vision, and more specifically, improving efficiency for detecting features using computer vision.

Techniques describe apparatus and method for generating computer vision (CV) labels, such as local binary pattern (LBP) labels, for sensor readings from sensor elements. Apparatus and methods are described for detecting features, such as edges, corners etc., by generating computed results based on sensor readings. The sensor apparatus may include a sensor element array that includes a plurality of sensor elements. In certain implementations, the sensor elements may be arranged in a 2-dimensional array, such as columns and rows, that is, the sensor elements can be arranged along at least a first dimension and a second dimension of the sensor element array. The sensor elements may be capable of generating sensor reading based on environmental conditions, such as signals or voltage differential based on light incident upon the sensor elements. The sensor apparatus may also include in-pixel circuitry coupled directly to the sensor element or peripheral circuitry coupled to the sensor element array and configured to receive output from one or more of sensor elements. The in-pixel circuitry and/or peripheral circuitry may include an at least one computation structure configured to generate labels for each of the sensor elements readings, by comparing the sensor readings for the subject sensor element with the sensor readings for neighboring sensor elements less than the number of sensor elements required for generating the label. In addition or alternatively, the computation structure may be implemented using a dedicated CV processing entity, such as an Application Specific Integrated Circuit (ASIC), Field Programmable Gate array (FPGA), microprocessor or any other computing logic.

An example apparatus for generating computed results based on sensor readings may include a sensor element array comprising a plurality of sensor elements, the plurality of sensor elements arranged along at least a first dimension and a second dimension of the sensor element array. Each of the plurality of sensor elements may be capable of generating a sensor reading based on light incident upon the sensor element. The sensor element array may include an array of pixels wherein each pixel comprises the sensor element and in-pixel circuitry, and the at least one computation structure is part of in-pixel circuitry coupled to the sensor element. In one implementation, the sensor element array is a vision sensor, and each of the sensor elements comprises a photo-diode.

The example apparatus may also include one computation structure configured to generate a computer vision (CV) label for a subject sensor element from the plurality of sensor elements, by comparing sensor reading for the subject sensor element with each of a subset of a plurality of neighboring sensor elements to the subject sensor element, the subset being smaller than the plurality of neighboring sensor elements required for generating a CV label for the subject sensor element. In one implementation, the at least one computation structure is part of peripheral circuitry coupled to the sensor element array and configured to receive output from the plurality of sensor elements including the subject sensor element and the plurality of neighboring sensor elements. In one example implementation, the computation structure is a digital computation structure.

The CV label for the subject sensor element may be a local binary pattern (LBP) label. In one aspect of the disclosure, eight computed comparisons between the subject sensor element and the neighboring sensor elements are required for generating the LBP label and at least four comparisons of the subject sensor element with the neighboring sensor elements used in generating the LBP label for the subject sensor element are computed while generating LBP labels for sensor elements other than the subject sensor element. The neighboring sensor elements to the subject sensor element may be immediately adjacent sensor elements to the subject sensor element.

In certain aspects of the disclosure, the computation structure may include one or more comparators configured to compare the sensor reading from the subject sensor element with sensor readings from the subset of the plurality of neighboring sensor elements to determine the threshold values for the respective neighboring sensor elements with respect to the subject sensor element, and retrieve threshold values generated for remaining neighboring sensor elements for the subject sensor element required for generating the CV label, wherein the threshold values for the remaining neighboring sensor elements were generated for determining the CV label for other sensor elements than the subject sensor element, respectively. In one implementation, a binary complement for the retrieved threshold values for the remaining neighboring sensor elements of the plurality of the neighboring sensor elements is used for generating the CV label.

The CV labels for each of the plurality of sensor elements may be used to generate one or more histograms for the sensor readings for a subset of the plurality of sensor elements and detecting a macro-feature by comparing the one or more histograms to previously stored histograms. In one aspect of the disclosure, the CV label for the subject sensor element is generated for detecting edges or CV features for a CV application. As used herein, a CV label can refer to a CV feature that is computed based on the comparison of a subject pixel with one or more of its neighboring pixel elements.

Aspects of the disclosure further disclose methods, and apparatus comprising means for performing aspects disclosed above and throughout the disclosure. Aspects of the disclosure, further disclose a non-transitory computer-readable storage medium, wherein the non-transitory computer-readable storage medium may include instructions executable by a dedicated computer vision microprocessor for performing aspects of the disclosure discussed above and throughout the specification.

The foregoing has outlined rather broadly features and technical advantages of examples in order that the detailed description that follows can be better understood. Additional features and advantages will be described hereinafter. The conception and specific examples disclosed may be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages, will be better understood from the following description when considered in connection with the accompanying figures. Each of the figures is provided for the purpose of illustration and description only and not as a definition of the limits of the claims.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

Techniques describe apparatus and method for generating CV labels, such as local binary pattern (LBP) labels, for sensor readings from sensor elements. As described in further detail below, such labels may be used in determining CV features, such as edges, corners, etc. Apparatus and methods are described for detecting CV features by generating computed results based on sensor readings. The sensor apparatus may include a sensor element array that includes a plurality of sensor elements. In certain implementations, the sensor elements may be arranged in a 2-dimensional array, such as columns and rows, that is, the sensor elements can be arranged along at least a first dimension and a second dimension of the sensor element array. The sensor elements may be capable of generating sensor readings based on environmental conditions, such as signals or voltage differential based on light incident upon the sensor elements. The sensor apparatus may also include in-pixel circuitry coupled directly to the sensor element or peripheral circuitry coupled to the sensor element array and configured to receive output from one or more sensor elements. The in-pixel circuitry and/or peripheral circuitry may include an at least one computation structure configured to generate labels for each of the sensor elements readings, by comparing the sensor readings for the subject sensor element with the sensor readings for neighboring sensor elements less than the number of sensor elements required for generating the label. In addition or alternatively, the computation structure may be implemented using a dedicated CV processing entity, such as an Application Specific Integrated Circuit (ASIC), Field Programmable Gate array (FPGA), microprocessor or any other computing logic.

A sensor may include a sensor element array of a plurality of sensor elements. The sensor element array may be a 2-dimensional array that includes sensor elements arranged in two dimensions, such as columns and rows, of the sensor element array. Each of the sensor elements may be capable of generating a sensor reading based on environmental conditions. In certain implementations, the sensor may be a vision sensor and may generate sensor readings based on light incident upon the sensor elements. FIG. 1 illustrates an example sensor 100 comprising a plurality of sensor elements arranged in a 2-dimensional array. In FIG. 1, the illustration of the sensor 100 represents 64 (8×8) sensor elements in the sensor element array. In various implementations, the shape of the sensor elements, the number of sensor elements and the spacing between the sensor elements may vastly vary, without departing from the scope of the invention. Sensor elements 102 represents example sensor elements from a grid of 64 sensor elements.

Figure 2:
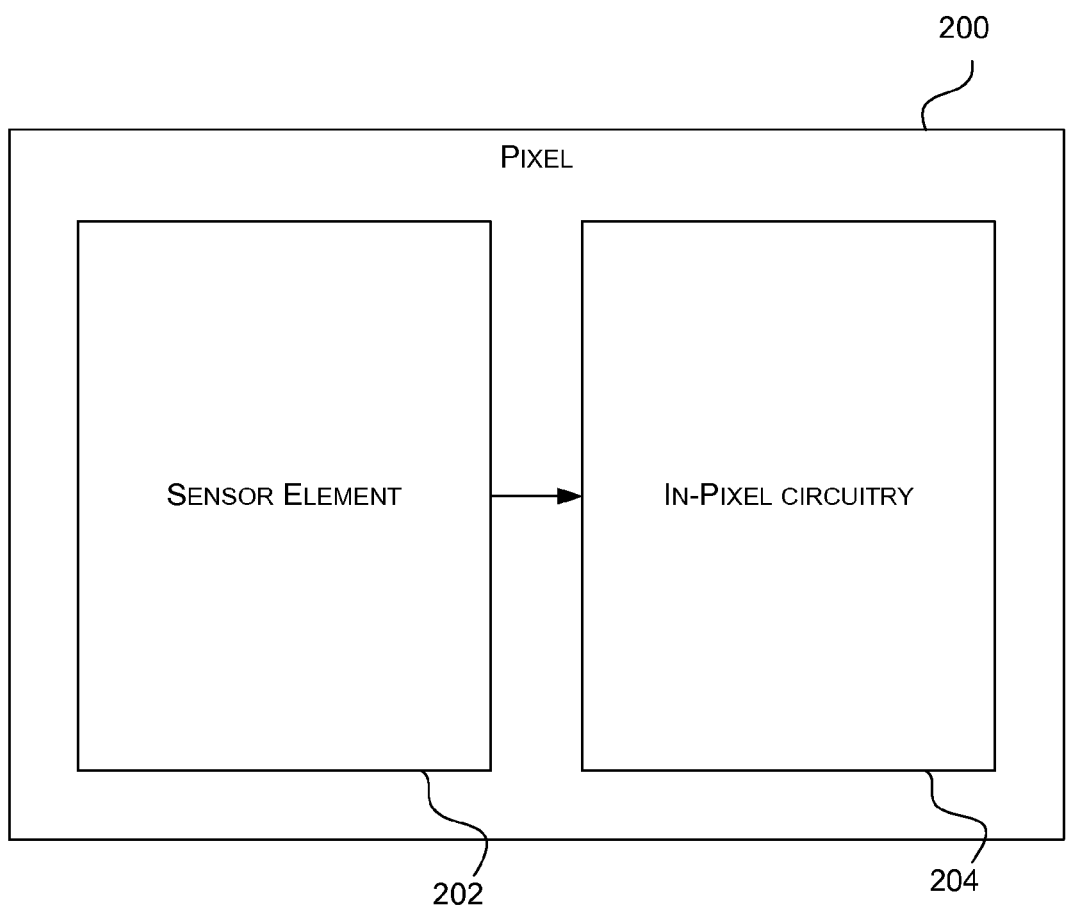
FIG. 2 illustrates an example pixel comprising a sensor element and in-pixel circuitry.

In certain implementations, the sensor elements may have dedicated CV computation hardware implemented as in-pixel circuitry (computation structure) coupled to the sensor element. In some implementations, the sensor element and the in-pixel circuitry together may be referred to as a pixel. The processing performed by the in-pixel circuitry coupled to the sensor element may be referred to as in-pixel processing. In some instances, the sensor element array may be referred to as the pixel array, the difference being that the pixel array includes both the sensor elements and the in-pixel circuitry associated with each sensor element. FIG. 2 illustrates an example pixel 200 with a sensor element 202 and in-pixel circuitry 204. In certain implementations, the in-pixel circuitry 204 may be analog circuitry, digital circuitry or any combination thereof.

Figure 3:
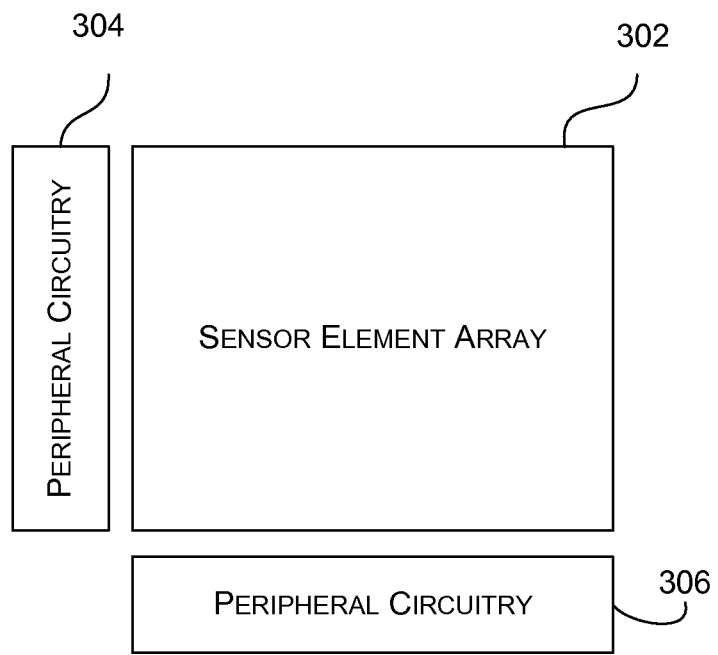
FIG. 3 illustrates an example peripheral circuitry coupled to sensory array.

In certain implementations, the sensor element array may have dedicated CV computation hardware implemented as peripheral circuitry (computation structure) coupled to a group of sensor elements. Such peripheral circuitry may be referred to as on-chip sensor circuitry. FIG. 3 illustrates an example peripheral circuitry (304 and 306) coupled to the sensor element array 302.

As described herein, the dedicated CV computation hardware computes CV features or localized CV features for a subject sensor element based on, at least in part, signals associated with a plurality of neighboring sensor elements in proximity to the subject sensor element. In some implementations, dedicated CV computation hardware computing CV or localized CV features (for example, hardware-based CV computation) differs from conventional software computing techniques in that software computing techniques run software-based CV computation algorithms on general purpose processors. Such CV features may then be computed for each of the plurality of sensor elements, taking each of the plurality of sensor elements as the subject sensor element. It is understood that, in some implementations, localized CV features can be computed for a block of one or more subject sensor elements rather than for a single subject sensor element. In other words, CV feature computations can be performed on summed or averaged signals corresponding not to a single sensor element but rather to blocks of sensor elements or pixels. In such implementations, discussions referencing a subject sensor element (or signals associated with a subject sensor element) and/or neighboring sensor elements (or signals associated with a plurality of neighboring sensor elements) can be understood to refer to a combined, summed, or averaged value associated with a block of subject sensor elements standing in for the subject sensor element or neighboring sensor elements. For example, a CV feature may be computed for sensor element block 103 based on, at least in part, signals (for example combined, summed, and/or averaged signals) associated with a plurality of neighboring sensor elements in proximity sensor element block 103, for example the plurality of neighboring sensor elements associated with sensor element blocks 104a, 104b, 104c, 104d, 104e, 104f, 104g, and/or 104h. It is understood that sensor element blocks 103, 104a, 104b, 104c, 104d, 104e, 104f, 104g, and/or 104h can include blocks of one by one sensor elements (one total sensor element), one by two sensor elements (two total sensor elements), two by two sensor elements (four total sensor elements), two by three sensor elements (six total sensor elements), three by three sensor elements (nine total sensor elements), etc. In general, sensor elements blocks can include any n by m block, where n and m can each independently be any number greater than one, but less that the number of sensor elements along one or another of the two dimensions of the sensor array.

Figure 4A:
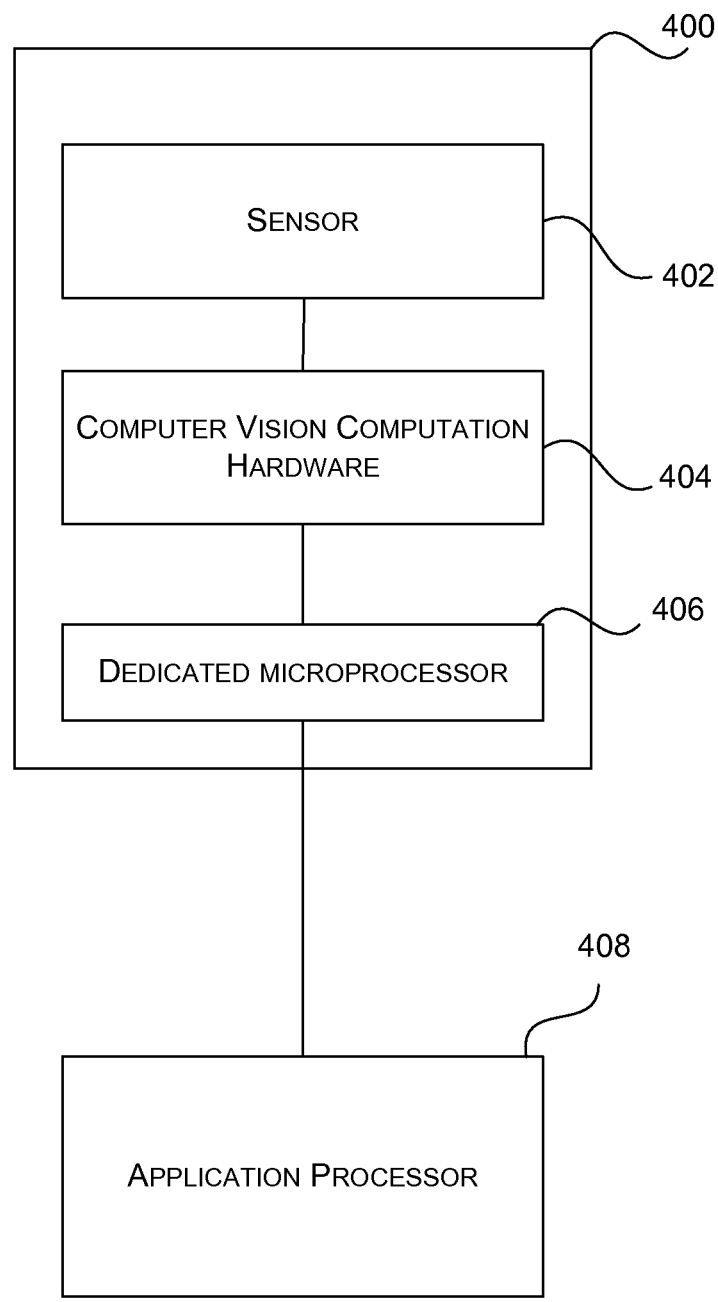
FIG. 4A illustrates an example sensor element array coupled to a dedicated computer vision (CV) processing module.

Furthermore, as shown in FIG. 4A, in certain implementations, the sensor apparatus 400 may have a sensor 402, computer vision computation hardware 404 and a dedicated microprocessor 404. The computer vision computation hardware 404 may be in-pixel or peripheral circuitry, as described in FIGS. 2, 3 for performing initial processing on the sensed information. The dedicated microprocessor 406 may be implemented using an ASIC, FPGA, embedded microprocessor, or any similar analog or digital computing logic for performing aspects of the disclosure.

It should be noted, that at least in certain implementations, the dedicated microprocessor 406 is in addition to an application processor 408 and not instead of the application processor 408. For example, the dedicated microprocessor 406 may receive indications of detected computer vision features, object-class detections, and/or pattern matches against previously stored images or reference indicators to determine macro-features or detect the presence or absence in an image of reference objects, such as smiles, faces, objects, etc. As used herein, macro-features can refer to an object (such as a face), or part or aspect of an object (skin texture, a smile, an expression on a face), that is detected using CV computations or operations that are based on computed, for example hardware-computed, CV features. The dedicated microprocessor 406 may send an indication of a macro-feature detection to the application processor 408. The application processor 408 may take that information and perform actions based on that input. For example, for a mobile device, the application processor 408 may unlock the mobile device screen after detecting the user's face. Similarly, for a puppy toy, the application processor 408 may generate a friendly audio bark when a smile is detected. In any case, higher level computer vision features can be computed by a low power system including the dedicated microprocessor 406, such as sensor apparatus 400, with power savings relative to computer vision feature computation directly by the application processor 408. This is especially the case in implementations where the applications processor is a higher power processor than the dedicated microprocessor 406.

Generally, such as in a mobile device context, the application processor 408 may be relatively more complex, compute-intensive, power-intensive and responsible for executing system level operations, such as operating system operations, and may implement the user interface for interacting with the user, perform power management for the device, manage memory and other resources, etc., while the dedicated microprocessor will be relatively less so. The application processor 408 may be similar to processor(s) 1710 of FIG. 17.

However, in certain implementations, the application processor 408 is less complex and low powered. For example, a toy that has camera and video capabilities may detect that the child is smiling within the sensor apparatus 400 itself and then perform the action of barking using logic from the application processor 408.

FIG. 4A discloses the dedicated microprocessor 406 coupled to the application processor 408 using a wired interface. Examples of a wired interface between the dedicated microprocessor 406 and the application processor 408 may include one or more of serial peripheral interface (SPI), Inter-Integrated Circuit (I2C), low voltage differential signaling (LVDS) or any other suitable wired protocol for that matter.

Figure 4B:
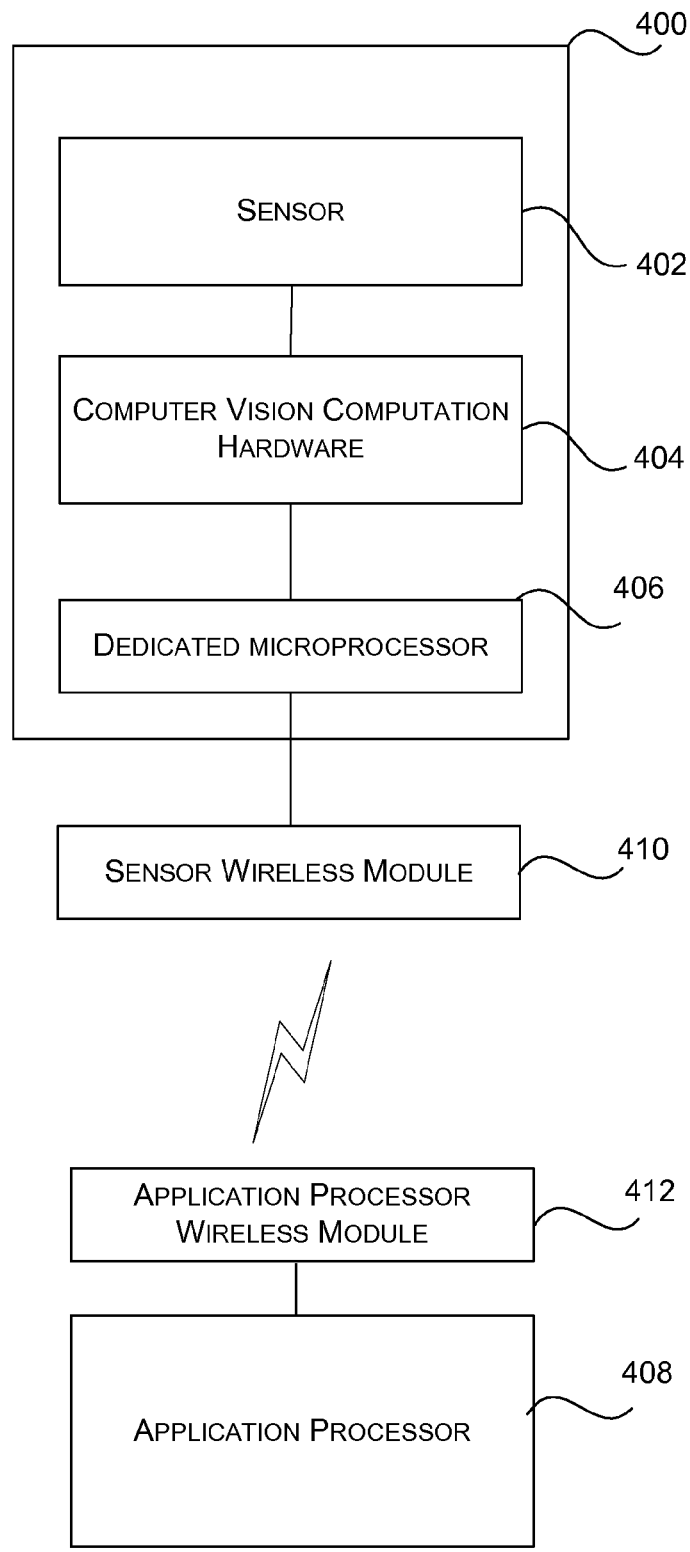
FIG. 4B illustrates an example sensor element array coupled to a dedicated computer vision (CV) processing module wirelessly.

However, as shown in FIG. 4B, in certain implementations, the dedicated microprocessor 406 may be coupled to the application processor 408 using a wireless interface. For connecting to application processor 408 wirelessly, the dedicated microprocessor 406 may be connected to an intermediate wireless module 410 coupled to the sensor apparatus 400, referred to as sensor wireless module 410 in FIG. 4B. In turn, the sensor wireless module 410 may wirelessly communicate with the application processor wireless module 412 that may be coupled to the application processor 408. The wireless modules may be configured to use one or more suitable wireless protocols to communicate with the application processor 408, such as Zigbee (IEEE 802.15.4 standard), Bluetooth®, body area network (IEEE 802.15.6), wireless USB, Wi-Fi (802.11), Z-wave, or IrDA (Infrared-based communications).

According to aspects of the disclosure, in certain embodiments, a variety of different sensors may be improved according to aspects of the current disclosure. Example sensors may include vision sensors, olfactory sensors and/or chemical sensors. Although vision sensors are discussed throughout the disclosure, similar techniques may be employed in other types of sensors without deviating from the scope of the invention.

Techniques, in one implementation, describe dedicated circuits or systems for the computing of features (e.g. CV features and macro-features) within in-pixel, peripheral circuitry, or dedicated microprocessor before the sensor data is sent to an application processor or any other processing entity external to the sensor apparatus. Such dedicated circuit for computation of a feature leads to power savings as (1) the circuit is optimized for computation of the specific feature, (2) less overheads are involved related to processor instruction decoding, memory transfers, etc.

In addition, macro-features such as face, smiles, etc. may be derived from the CV features and may also be generated using the computer vision computation hardware 404 and/or dedicated microprocessor 406.

Figure 5:
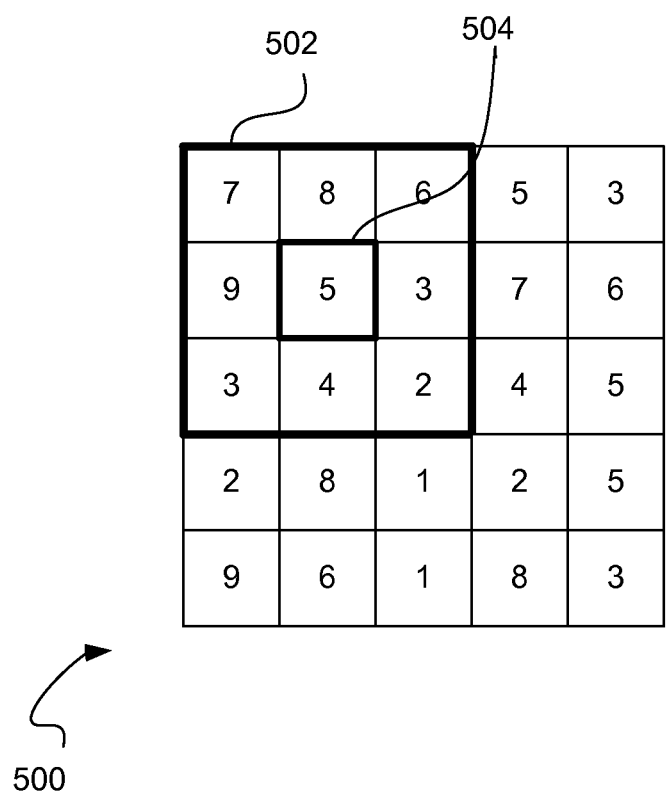
FIG. 5 illustrates a plurality of sensor readings from a sensor element array depicting a frame of an image.

FIG. 5 illustrates a group of sensor readings from a sensor element array depicting an example sub-portion 500 of an image. In some instances, each sensor reading from the sensor element array may be referred to as an image pixel value. A label may be generated for each or most of the sensor elements. In FIG. 5, window 502 represents a 3×3 window of sensor readings for generating a label for sensory element 504. In one implementation, a histogram may be generated for the window by using labels associated with each sensor element from the window.

For the sub-portion 500 of the image shown, nine 3×3 windows similar to window 502 are possible, and hence for sub-portion 500, nine labels may be computed. The labels can then be used to generate a histogram. Such a histogram may represent certain feature identifying information about the plurality of sensor readings of sensor elements within the sub-portion 500 of the image. The histogram may be analyzed based on statistics or heuristics for identifying or detecting a feature from the plurality of sensor readings within image. In some implementations, the histogram can be compared to a previously stored one or more histograms.

Figures 6A, 6B, 6C:
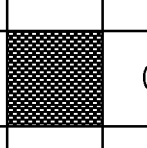
FIGS. 6A, 6B, and 6C illustrate an example method for generating a local binary pattern (LBP) for a sensor element reading.

In one implementation, local binary patterns (LBP) may be used for generating labels associated with each sensor element. In turn, LBP labels may be used for generating the histogram. FIGS. 6A-6C illustrates an example technique for generating an LBP label for a sensor element.

FIG. 6A illustrates several example sensor readings sampled or sensed from a plurality of sensor elements from the sensor element array, with a center sensor element value "70" with eight neighboring sensor readings. In FIG. 6B, a difference is calculated or a comparison is made between the center sensor element reading and the adjacent sensor element readings. The values shown in FIG. 6B are generated by subtracting the center image sensor reading from each of the adjacent sensor element readings, respectively, to generate the resulting difference, respectively, for each of the adjacent sensor elements. In FIG. 6C, a threshold binary value is generated for each adjacent sensor element. All negative resultant difference values from FIG. 6B are converted to zero's and all positive resultant difference values from FIG. 6B are converted to one's. In certain implementations, the steps from 6B and 6C may be combined into a single step using a comparator that outputs the comparison as binary number based on if one number is larger, equal or smaller to the other number.

Once the threshold values are determined for each of the adjacent sensor elements, the LBP label is generated for the center sensor element by either concatenating the threshold values in binary, for example "00001111" or summing up the binary values multiplied by 2 raised to the power of the placement of the sensor element:

$$1*1+1*2+1*4+1*8+0*16+0*32+0*64+0*128=15$$

As shown above, the resulting label (decimal) value is "15" for the center sensor element.

Figure 7:
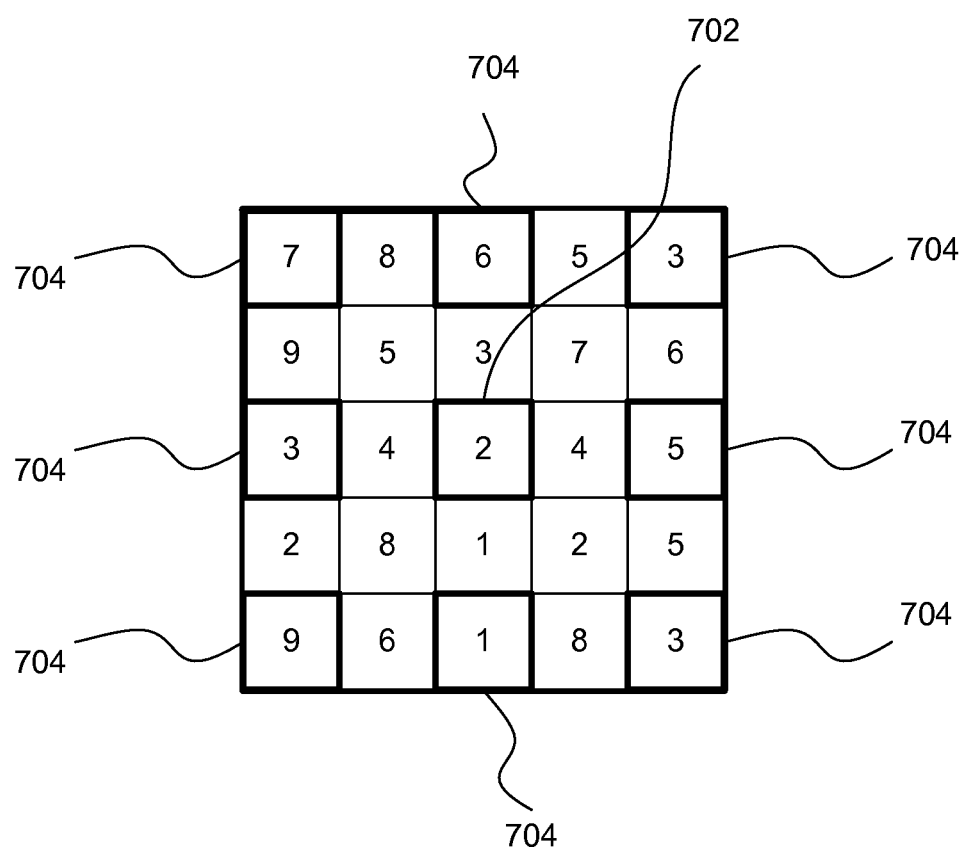
FIG. 7, illustrates example neighboring sensor elements for generating a CV label.

The implementation illustrated with respect to FIGS. 6A, 6B and 6C above, is provided as an illustration of generating labels, and more specifically, LBP labels. However, aspects of the disclosure are not limited by illustration provided with respect to FIGS. 6A, 6B and 6C. For instance, as shown in FIG. 7, a label may be generated for a subject sensor element by using sensor readings from sensor elements that are not immediately adjacent to the sensor element. For example, in FIG. 7, the subject sensor element 702 and the neighboring sensor elements 704 that are to be used for generating the LBP label are not immediately adjacent to each other. Furthermore, although, FIG. 7 illustrates using readings from eight sensor elements with respect to the subject sensor element to generate the LBP label any suitable number of sensor readings may be used in generating the LBP label. Furthermore, it is understood that various implementations disclosed herein illustrated with respect to pixel-level LBP could also apply to multi-block LBP. In multi-block LBP, blocks of pixels are summed and/or averaged, for example, 2 by 2 blocks of pixels. The sample, difference, and threshold shown in FIGS. 6A to 6C are then performed on these block sums or averages rather than on the pixel-level values as assumed by the discussion above in FIGS. 6A to 6C. The various implementations disclosed herein can also be applied to various extensions of LBP, including but not limited to, local ternary patterns (LTP). The size of the blocks whose pixel values are averaged and/or summed can range depending upon the CV application. In some implementations, the blocks can be up to 11 pixel by 11 pixel blocks, or even larger.

Figure 8:
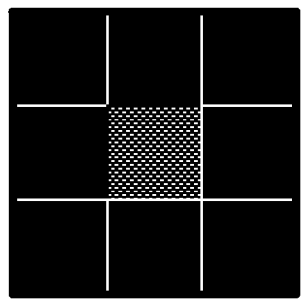
FIG. 8 illustrates example representation of potential CV features detected at a sensor element, according to aspects of the disclosure.
Figure 8:
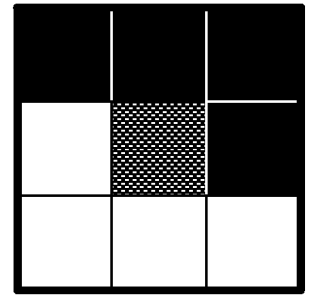
Figure 8:
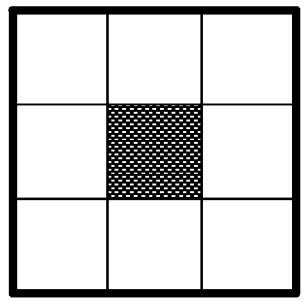
Figure 8:
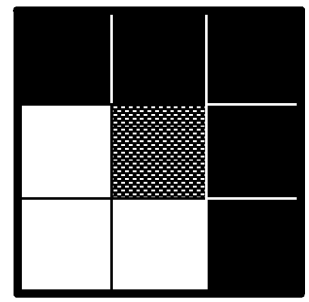
Figure 8:
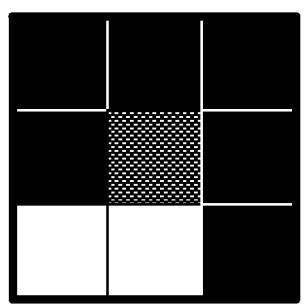

FIG. 8 illustrates example representation of potential CV features detected for a subject sensor element, according to certain aspects of the disclosure. CV features or localized CV features may refer to low level CV markers or indicators, such as labels associated with each sensor element or pixel of the sensor. The dark boxes represent a zero threshold value and white boxes represent a one threshold value. As shown in FIG. 8, several CV features, such as spot, flats, line end, edge and corner may be detected in the process of generating an LBP label for sensor readings from a sensor. An LBP label may indicate if the CV feature from the reference of the sensor element represents an edge, corner, curve, spot, etc. Other techniques such as histogram of signed gradients (HSG) or other suitable variants of LBP may be used for detecting CV features without deviating from the scope of the disclosure.

Figures 9A, 9B, 9C:
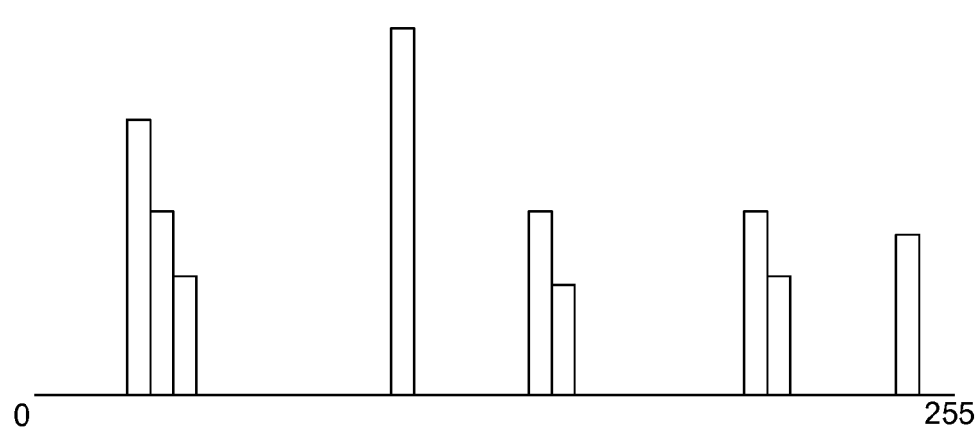
FIGS. 9A, 9B and 9C illustrate the process of converting the sensor readings from a plurality of sensor elements to a histogram using LBP labels.

FIGS. 9A, 9B and 9C illustrate the process of converting the sensor readings from a plurality of sensor elements to a histogram using LBP labels. FIG. 9A illustrates a group of sensor readings (window 502) from the plurality of sensor readings from FIG. 5 that are under consideration for generating a histogram and detecting features.

FIG. 9B illustrates the process of generating the binary threshold values for the center sensor element 504, using the process described in FIGS. 6A-C. The label generated for the center sensor element may be represented by the binary value 1111000. Similarly, an LBP label can generated for different windows 502 and center sensor elements 504 than the one shown in FIG. 5 to generate, for example, a histogram similar to that shown in FIG. 9C. Each label may provide an indication of a CV feature from the perspective of the subject sensor element.

FIG. 9C illustrates a histogram using the labels generated for each of the sensor elements from a whole image or portion of an image, for example sub-portion 500 of FIG. 5. As shown in FIG. 9C, each of the LBP labels for the sensor readings from window 502 may fall anywhere on a histogram with 255 slots.

Such a histogram may represent certain feature identifying information about the plurality of sensor readings from the example sub-portion 500. The histogram may be analyzed based on statistics or heuristics for identifying or detecting a feature from the plurality of sensor readings within image. In some implementations, the histogram can be compared to a previously stored histogram.

It is to be noted, however, that the histogram from FIG. 9C is not drawn to scale or based on calculated values, and simply represent a visual illustration of a histogram. The generated histogram may be used for detecting macro-features for computer vision. For example, certain histogram patterns may represent smiles, faces, objects, etc.

As illustrated in FIGS. 6A-C and FIGS. 9A-C, at least in one implementation, generating the LBP label for a sensor reading results in eight separate comparisons between the subject sensor reading and the adjacent or neighboring sensor readings. Such comparisons are performed between the sensor readings from the subject sensor element and the other sensor readings from the group of sensor elements for generating the labels. In some implementations, these comparisons are performed using one or more comparators, similar to the comparator shown in FIG. 17. Performing these comparisons consume power, time and circuitry on these generally miniature sensors.

Figure 10A:
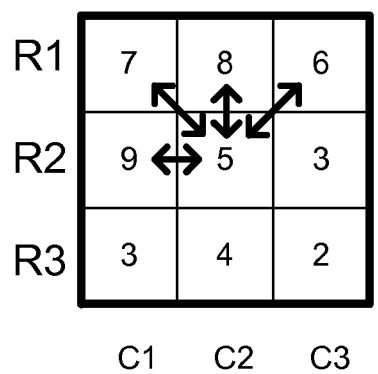
FIG. 10A and FIG. 10B illustrate generating the LBP label using four comparisons instead of eight comparisons.
Figure 10B:
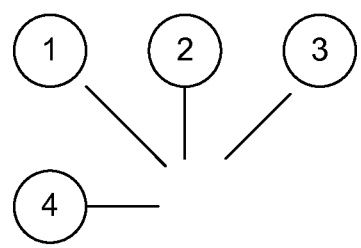

Embodiments described herein, describe techniques for generating the labels more efficiently for sensor reading for a subject sensor element by reducing the number of comparisons. As shown in FIG. 10A, for generating an LBP label for the center sensor reading of "5", aspects of the disclosure describe comparing the center sensor reading to only four sensor readings from the neighboring sensor elements, instead of eight sensor reading comparisons. FIG. 10B illustrates the four comparisons between the sensor readings for the sensor elements for generating the LBP value. For example, in the first clock cycle "5" is compared to "7", in the second clock cycle "5" is compared to "8", in the third clock cycle "5" is compared to "6" and in the fourth cycle "5" is compared to "9".

FIGS. 11A-H illustrate an example process for generating the LBP label for any given sensor by only performing four comparisons. The remaining four comparisons are performed as part of computing the LBP labels for other sensor elements. It is to be noted that FIGS. 11A-H provide an example representation for generating a label, and implementations may vary in terms of what is considered a neighboring pixel or how many total threshold values are needed for generating the labels for a subject sensor element.

Figures 11A, 11B, 11C, 11D:
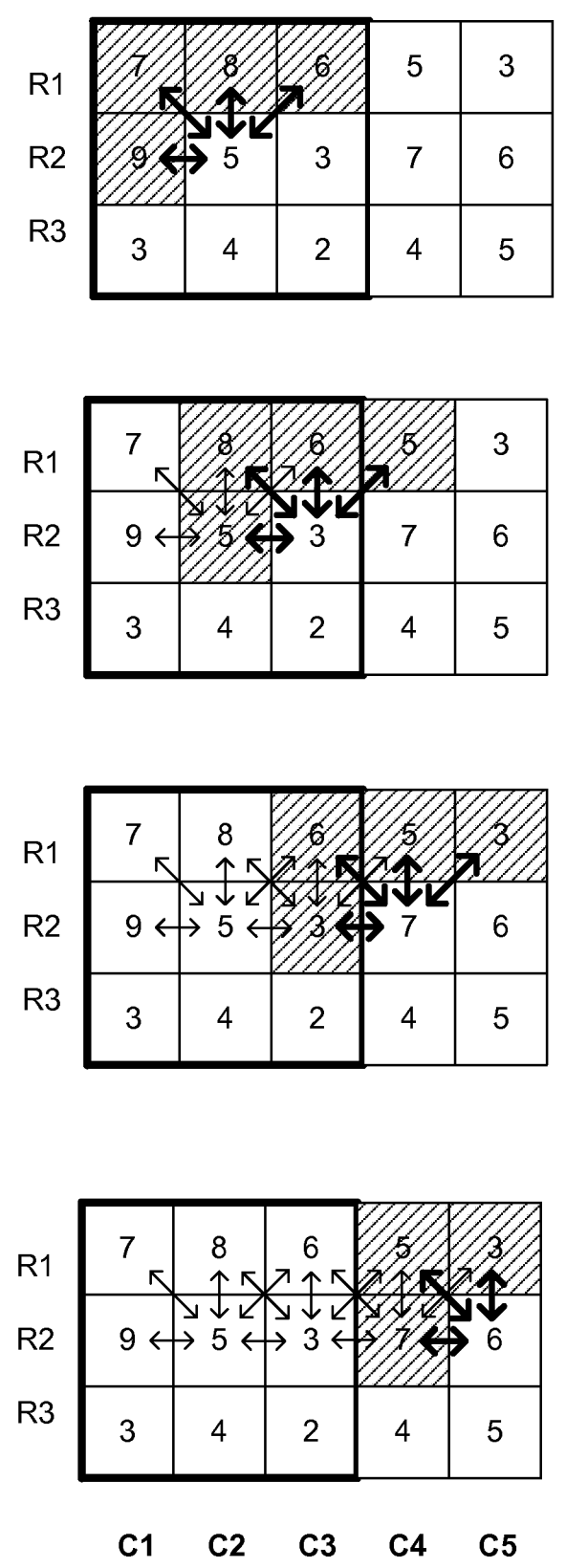

FIG. 11A illustrates four comparisons (bolded arrows) between "5" (R2C2) and the shaded sensor element readings. FIG. 11B illustrates four comparisons (bolded arrows) between "3" (R2C3) and the shaded sensor element readings. FIG. 11C illustrates four comparisons (bolded arrows) between "7" (R2C4) and the shaded sensor element readings. FIG. 11D illustrates three comparisons (bolded arrows) between "6" (R2C5) and the shaded sensor element readings.

Figure 11E:
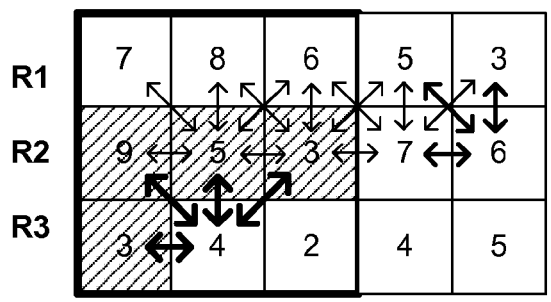
Figure 11F:
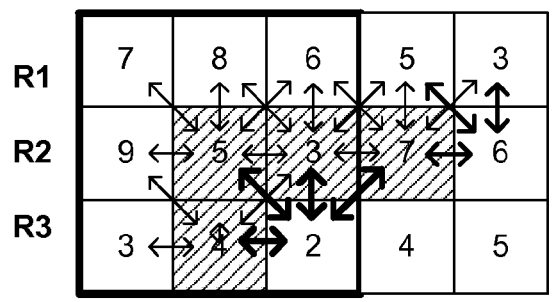
Figure 11G:
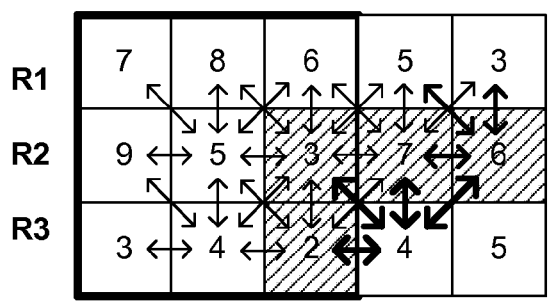

Similarly, FIG. 11E illustrates four comparisons (bolded arrows) between "4" (R3C2) and the shaded sensor element readings. FIG. 11F illustrates four comparisons (bolded arrows) between "2" (R3C3) and the shaded sensor element readings. At 11F, even though only four comparisons were performed for R2C2 (sensor element with reading value "5") in FIG. 11A, the comparisons of R2C2 with all of its neighbors is now complete, and all comparison values needed to compute an LBP label for R2C2 are now available. FIG. 11G illustrates four comparisons (bolded arrows) between "4" (R3C4) and the shaded sensor element readings.

Figure 11H:
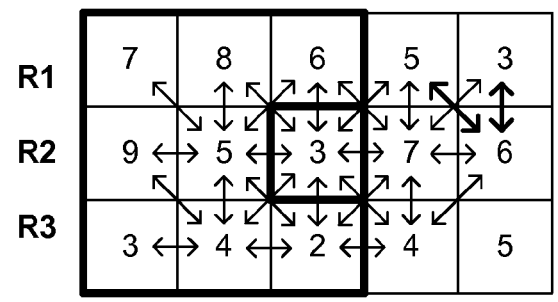

As illustrated in FIG. 11H with sensor element R2C3, even though only four comparisons were performed for R2C3 (sensor element with reading value "3") in FIG. 11B, the comparisons between R2C3 and all eight of its neighboring sensor elements are available for the R2C3 sensor element in FIG. 11H. According to certain aspects of the disclosure, comparisons performed for the generation of the LBP label for the other sensor element readings are reused in the generation of the LBP label for R2C3 (after performing a Two's or binary complement of the stored threshold value). For example, the comparisons in FIG. 11B provide only four threshold values (shaded sensor element readings) for the LBP label generation for R2C3. At this point, the comparisons between R2C3 and R2C4, R3C2, R3C3 and R3C4 remain for generating the respective threshold values.

FIG. 11C provides the comparison between R2C3 and R2C4. FIG. 11E provides the comparison between R2C3 and R3C2. FIG. 11F provides the comparison between R2C3 and R3C3. FIG. 11G provides the comparison between R2C3 and R3C4. Therefore, as shown in FIG. 11H, all eight comparisons for sensor element reading R2C3 are available with its eight neighboring sensor element readings for calculating the threshold values and then generating the LBP label, although only four comparisons were performed for R2C3 in FIG. 11B. Although the illustrated implementations provide for the ability to compute the LBP label using only four comparisons, it is understood that the comparison number reduction may be only partial, so that the number of comparisons is more than four, but is less than eight, in some implementations. Hence, in such implementations, the number of comparisons can be at least four. It should be noted, that as shown in FIGS. 11A-11G, each comparison between any two sensor element reading is performed only once resulting in power, time and circuitry savings.

It should also be noted, that the example described in FIGS. 11A-11H, merely illustrate an example technique for reducing the number of comparator operations and time for generating the LBP labels. Several improvements are also envisioned to be possible without deviating from the scope of the invention. For example, several row operations may be performed simultaneously or in-parallel using multiple duplicated in-pixel circuitry, peripheral circuitry or dedicating CV processing resources. For example, operations from FIGS. 11A and 11B may be performed in parallel, wherein during the first clock cycle, R2C2 ("5") and R1C1 ("7") are compared along with R2C3 ("3") and R1C2 ("9").

In some instances, the threshold values generated for each comparison are stored in a memory buffer so that the threshold values can be reused (retrieved) for generating LBP labels for the neighboring sensory elements. It should be noted that the retrieved threshold value may be stored as a complementary value (example, using Two's complement) so that a "zero" is stored for a "one" threshold and vice-versa (Two's complement). In other implementations, a Two's complement may be performed at the time of retrieving the stored value. The complementary value may be stored to account for the reversal in the comparison (subtraction) operation. Referring to FIG. 11A, for generating the label for R2C2, "5" is subtracted from "3" to generate the resultant difference and consequently the threshold value. However, for generating the label for R2C3, "3" is subtracted from "5" resulting in the opposite threshold value.

Figure 12:
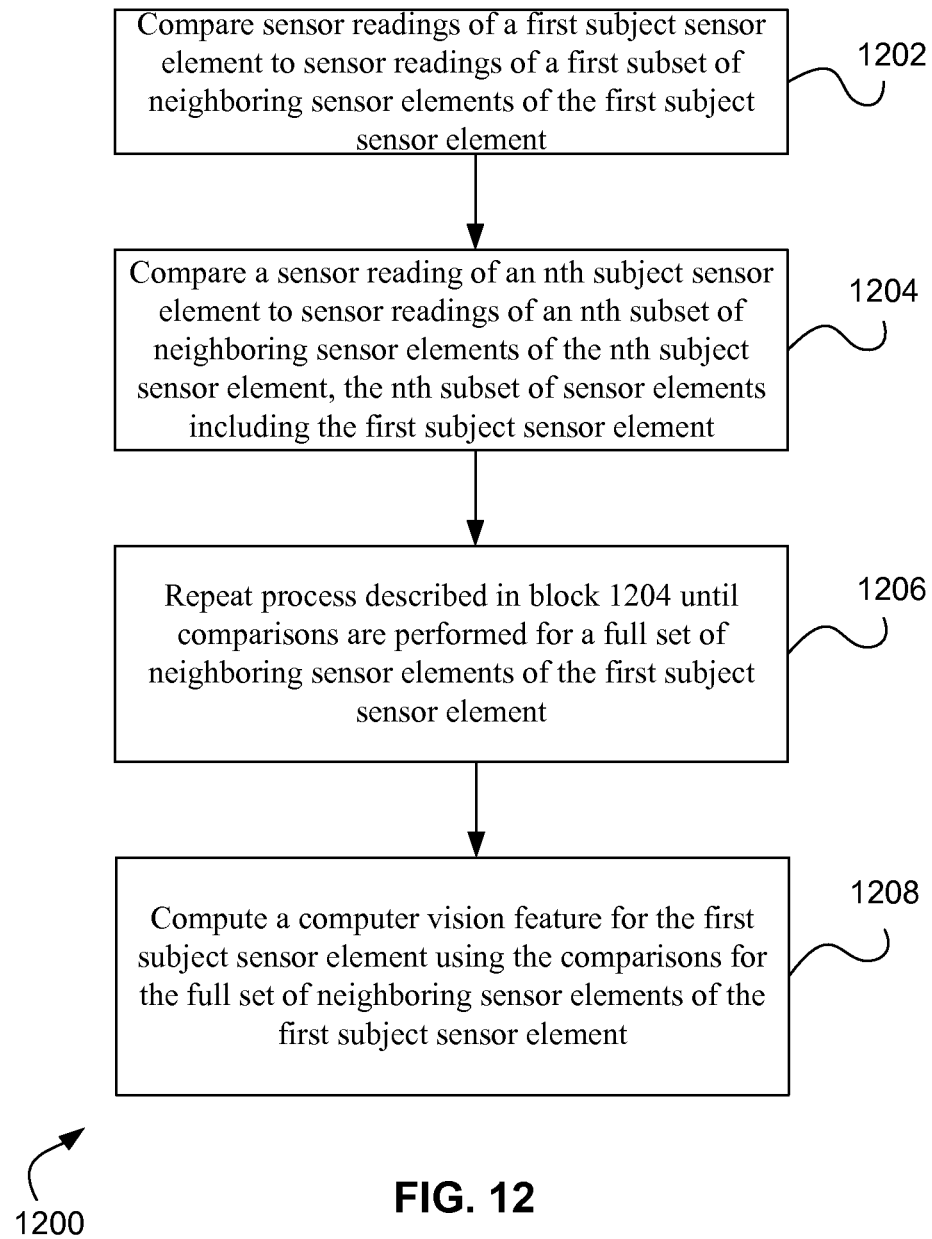
FIG. 12 is an example flowchart, according to certain aspects of the disclosure.

FIG. 12 is an example flowchart, according to certain aspects of the disclosure. Some or all of the process 1200 (or any other processes described herein, or variations and/or combinations thereof) may be performed by circuitry or logic. The circuitry or logic may be implemented in the in-pixel circuitry, peripheral circuitry or dedicated CV processing logic, or any combinations thereof. In some instances all or portions of the logic may be implemented using instructions, executed on the digital circuitry and stored on a non-transitory computer readable storage medium.

At block 1202, components associated with a sensor element array may compare sensor readings of a first subject sensor element to sensor readings of a first subset of neighboring sensor elements of the first subject sensor element. At block 1204, components associated with the sensor element array may compare a sensor reading of an nth subject sensor element to sensor readings of an nth subset of neighboring sensor elements of the nth subject sensor element, the nth subset of sensor elements including the first subject sensor element. At block 1206, components of the sensor may repeat process described in block 1204 for different subject sensor elements (where n is an incremented value) until comparisons are performed for a full set of neighboring sensor elements of the first subject sensor element. At block 1208, components of the sensor element array may compute a computer vision feature for the first subject sensor element using the comparisons for the full set of neighboring sensor elements of the first subject sensor element. In one implementation, the CV feature is calculated by generating LBP labels. Two's or binary complement for at least some of the comparisons may be used in generating the LBP labels.

It should be appreciated that the specific steps illustrated in FIG. 12 provide a particular method of computing or generating a computer vision feature or label, according to one embodiment. Other sequences of steps may also be performed in alternate embodiments. For example, alternative embodiments may perform the steps/blocks outlined above in a different order. To illustrate, a user may choose to change from the third mode of operation to the first mode of operation, the fourth mode to the second mode, or any combination therebetween. Furthermore, although block 1202 references a "first subject sensor element," it is understood that the use of the term "first" is not intended to imply an ordering of the steps in FIG. 12, but can serve as a label to distinguish the first subject sensor element from the nth subject sensor element. Similarly, in some implementation, it is possible that the repeating of the process as described in block 1206 may continue until the full set of neighboring sensor elements of the first subject sensor element have been compared with the first subject sensor element, and, the comparisons in block 1202 may serve as the comparisons that result in the completion of the process of comparing the first subject sensor element with the full set of the neighboring sensor elements of the first subject sensor element. Moreover, the individual steps/blocks illustrated in FIG. 12 may include multiple sub-steps that may be performed in various sequences as appropriate to the individual step. Furthermore, additional steps/blocks may be added or removed depending on the particular applications. One of ordinary skill in the art would recognize and appreciate many variations, modifications and alternatives of the process.

Figure 13A:
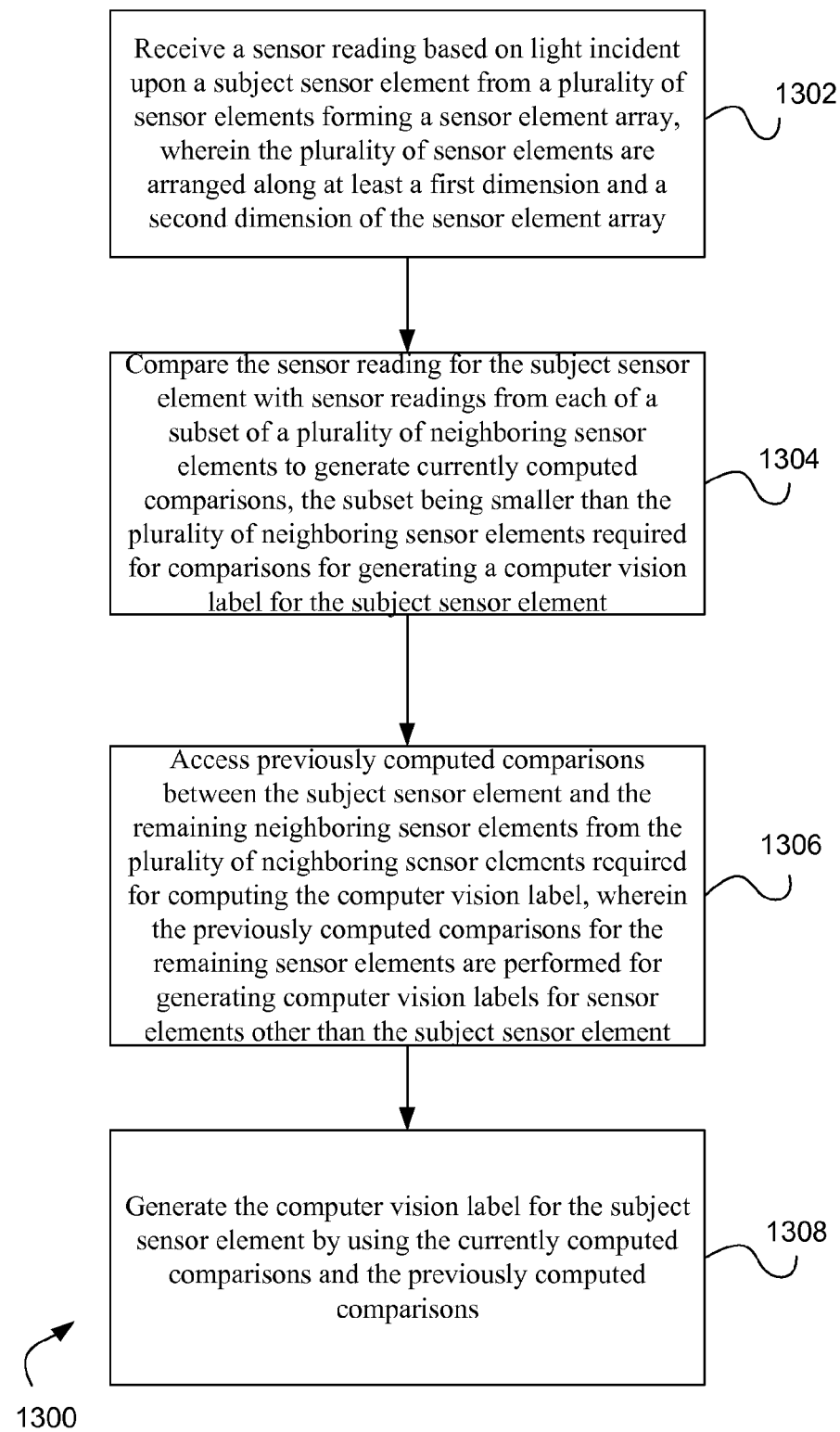
FIG. 13A is an example flowchart, according to certain aspects of the disclosure.

FIG. 13A is another example flowchart, according to certain aspects of the disclosure. Some or all of the process 1300 (or any other processes described herein, or variations and/or combinations thereof) may be performed by circuitry or logic. The circuitry or logic may be implemented in the in-pixel circuitry, peripheral circuitry, dedicated CV processing logic, or any combinations thereof. In some instances, all or portions of the logic may be implemented using instructions, executed on the digital circuitry and stored on a non-transitory computer readable medium.

At block 1302, components, such as the subject sensor element receives sensor reading based on light incident upon a subject sensor element, wherein the subject sensor element comprises a photodiode. The sensor elements may have photodiodes that provides a means for receiving sensor readings based on the light incident upon the subject sensor element. In one implementation, the sensor readings are a voltage reading caused by the incident light upon the sensor element. In another implementation, the sensor reading is a change in the voltage beyond a threshold from a previous stored voltage value in a buffer or a capacitor.

The subject sensor element may be one from a plurality of sensor elements forming a sensor element array. The plurality of sensor elements may be arranged along at least a first dimension and a second dimension of the sensor element array, similar to the illustration of a sensor element array shown in FIG. 1.

At block 1304, components, such as a computation structure, may compare sensor reading for the subject sensor element with sensor readings from each of a subset of a plurality of neighboring sensor elements to generate currently computed comparisons. The computation structure may have comparators, as discussed in FIG. 14, that provides a means for comparing sensor reading for the subject sensor element with sensor readings from each of a subset of a plurality of neighboring sensor elements. The number of sensor elements in the plurality of neighboring sensor elements may be the required number of comparisons to generate the CV label. Furthermore, the subset of the plurality of neighboring sensor elements are smaller than the plurality of neighboring sensor elements. The computation structure may be an analog computation structure and include analog comparators, or the computation structure may be a digital computation structure and include digital logic for comparing the sensor readings amongst each other. As discussed with reference to FIG. 15, comparing, at a computation structure, the sensor reading for the subject sensor element with sensor readings from each of a subset of a plurality of neighboring sensor elements can include comparing, at a parallel computation structure, the sensor reading for each of a plurality of subject sensor elements to a sensor element neighboring the each of the plurality of subject sensor elements simultaneously.

At block 1306, components, such as the computation structure, may access previously computed comparisons between the subject sensor element and the remaining neighboring sensor elements from the plurality of neighboring sensor elements required for computing the CV label. As used herein, remaining neighboring sensor elements can include the plurality of neighboring sensor elements required for computing a CV label, but not included in the subset of neighboring sensor elements. Temporary buffers or memory may provide a means for storing the values for the previously computed comparisons that are accessed by the computation structure. In certain implementations, a binary or two's complement of the retrieved threshold values for the remaining neighboring sensor elements may be used for generating the CV label. A binary or two's complement of a number behaves like the negative of the original number in most arithmetic, and positive and negative numbers can coexist in a natural way. As shown in FIGS. 11A-H, the computed comparisons for the remaining sensor elements are performed for generating CV labels for sensor elements other than the subject sensor element. The previously computed comparisons may be retrieved or accessed from buffers storing the precomputed results, or from corresponding computation structure (e.g., via latches) computing comparisons in parallel for other sensor elements. In alternative implementations, components such as the computation structure may access subsequently computed comparisons between the subject sensor element and the remaining neighboring sensor elements from the plurality of neighboring sensor elements required for computing the CV label.

At block 1308, once the computation structure has the comparisons for all the neighboring sensor elements from the plurality of neighboring sensor elements, the computation structure may generate the CV label. Hence, the computation structure may generate the CV label for the subject sensor element based on the currently computed comparisons and the previously computed comparisons, the previously computed comparisons having been generated while computing a CV label for a sensor element other than the subject sensor element. As noted above with reference to block 1306, in some implementations, the computation structure can generate the CV label for the subject sensor element based on the currently computed comparisons and subsequently computed comparisons, where the subsequently computed comparisons are performed after the currently computed comparisons while computing a CV label for a sensor element other than the subject sensor element. The computation structure may have digital and/or analog logic, as discussed with reference to FIG. 14, for providing a means for generating the CV label. In certain implementations, the comparisons are further categorized using binary thresholds of 'one' and 'zero', as described in FIGS. 6C and 9B.

A CV label identifies features or provides attributes associated with the sensor readings at any given point in time for a subject sensor element with respect to the sensor readings relatively close to the subject sensor element. The sensor elements relatively close to the subject sensor element may be referred to as neighboring sensor elements. In certain aspects of the disclosure, the neighboring sensor elements may include sensor elements immediately adjacent to the subject sensor element. In certain other aspects of the disclosure, neighboring sensor elements may also include sensor elements that are relatively close to the subject sensor element and not immediately adjacent. For example, in certain instances, sensor elements within three sensor elements from the subject sensor element may still be considered neighboring sensor elements when the width or height of the number of sensors is sixty four sensor elements. In certain implementations of the disclosure, the CV labels may be LBP labels.

These LBP labels may be used to generate histograms and identify features, as described in more detail in FIGS. 9A-C. In certain implementations of generating LBP labels, eight computed comparisons between the subject sensor element may be required for generating the LBP label. In certain implementations of generating the LBP label at least four comparisons are precomputed while generating LBP labels for sensor elements other than the subject sensor element for generating the LBP label for the subject sensor element.

However, several different variations of generating LBP labels or labels similar to LBP labels may be practiced without deviating from the scope of the disclosure. For example, certain implementations of generating labels may use more than or less than eight comparisons between the subject sensor element and the neighboring reference elements in generating the labels. Furthermore, in certain implementations, the labels may be generated using neighboring sensor elements that are immediately adjacent, a few sensor elements away or any combination thereof.

It should be appreciated that the specific steps illustrated in FIG. 13A provide a particular method of computing or generating a computer vision feature or label, according to one embodiment. Other sequences of steps may also be performed in alternate embodiments. For example, alternative embodiments may perform the steps/blocks outlined above in a different order. To illustrate, a user may choose to change from the third mode of operation to the first mode of operation, the fourth mode to the second mode, or any combination therebetween. Moreover, the individual steps/blocks illustrated in FIG. 13A may include multiple sub-steps that may be performed in various sequences as appropriate to the individual step. Furthermore, additional steps/blocks may be added or removed depending on the particular applications. One of ordinary skill in the art would recognize and appreciate many variations, modifications and alternatives of the process.

Figure 13B:
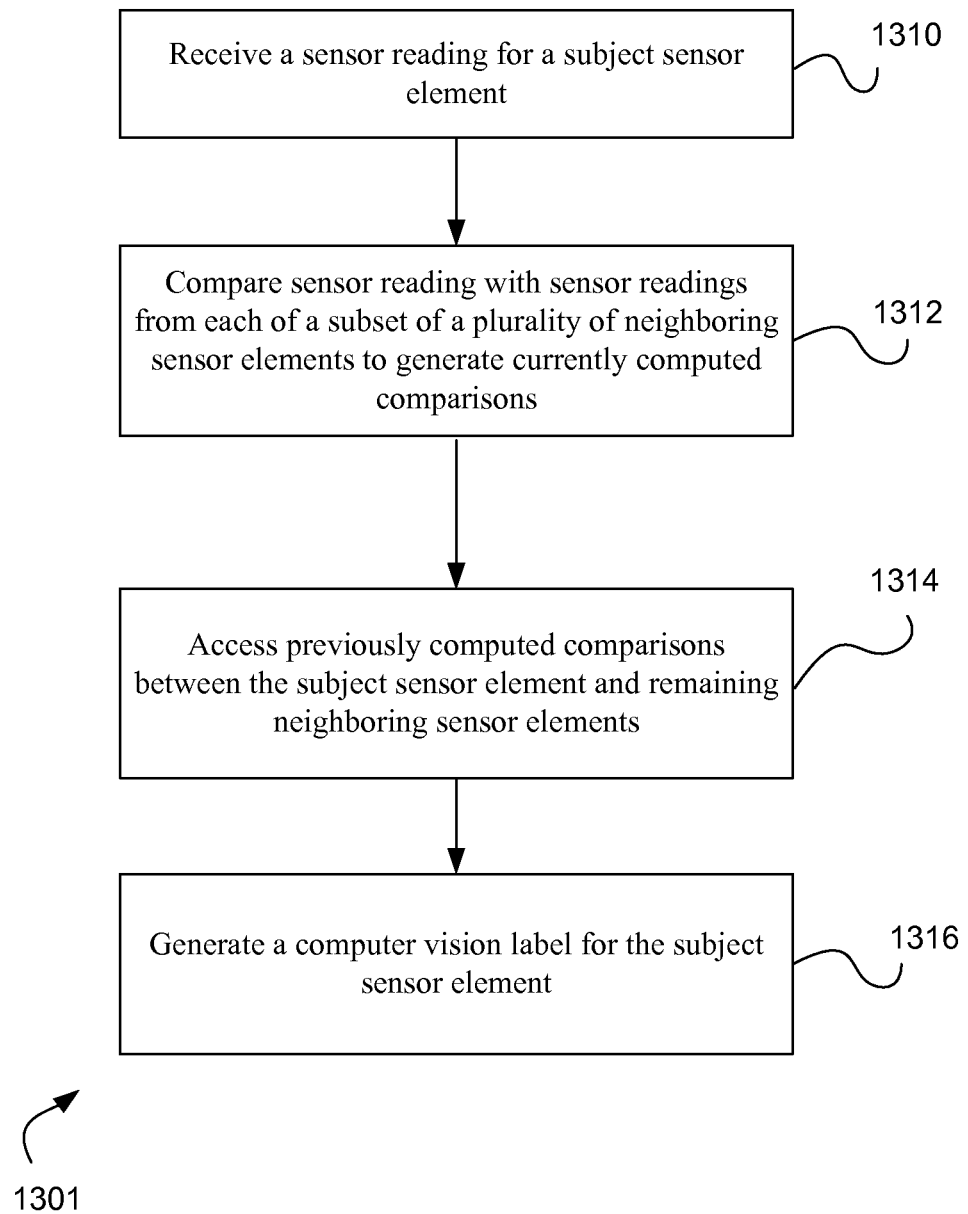
FIG. 13B is also an example flowchart, according to certain aspects of the disclosure.

FIG. 13B is another example flowchart, according to certain aspects of the disclosure. Some or all of the process 1301 (or any other processes described herein, or variations and/or combinations thereof) may be performed by circuitry or logic. The circuitry or logic may be implemented in the in-pixel circuitry, peripheral circuitry, dedicated CV processing logic, or any combinations thereof. In some instances, all or portions of the logic may be implemented using instructions, executed on the digital circuitry and stored on a non-transitory computer readable medium.

At block 1310, the sensor receives a sensor reading for a subject sensor element or a block of subject sensor elements. The subject sensor element might have a photodiode as the sensing element. Sensor readings may include detecting light using the photodiodes. In one implementation, the sensor readings are a voltage reading caused by the incident light upon the sensor element. In another implementation, the sensor reading is a change in the voltage beyond a threshold from a previous stored voltage value in a buffer or a capacitor.

At block 1312, components compare sensor reading with sensor readings from each of a subset of a plurality of neighboring sensor elements to generate currently computed comparisons. The subset of the plurality of neighboring sensor elements are smaller than the plurality of neighboring sensor elements.

At block 1314, components access previously computed comparisons between the subject sensor element and remaining neighboring sensor elements. As shown in FIGS. 11A-H, the previously computed comparisons for the remaining sensor elements are computed while generating CV labels for sensor elements other than the subject sensor element. The previously computed comparisons may be retrieved or accessed from buffers storing the precomputed results, or from corresponding computation structure (e.g., via latches) computing comparisons in parallel for other sensor elements.

At block 1316, components generate a CV label for the subject sensor element or blocks of sensor elements. The CV label can be generated based on the current comparisons and the previously computed comparisons, as disclosed elsewhere herein.

A CV label identifies features or provides attributes associated with the sensor readings at any given point in time for a subject sensor element with respect to the sensor readings relatively close to the subject sensor element. The sensor elements relatively close to the subject sensor element may be referred to as neighboring sensor elements.

It should be appreciated that the specific steps illustrated in FIG. 13B provide a particular method of computing or generating a computer vision feature or label, according to one embodiment. Other sequences of steps may also be performed in alternate embodiments. For example, alternative embodiments may perform the steps/blocks outlined above in a different order. To illustrate, a user may choose to change from the third mode of operation to the first mode of operation, the fourth mode to the second mode, or any combination therebetween. Moreover, the individual steps/blocks illustrated in FIG. 13B may include multiple sub-steps that may be performed in various sequences as appropriate to the individual step. Furthermore, additional steps/blocks may be added or removed depending on the particular applications. One of ordinary skill in the art would recognize and appreciate many variations, modifications and alternatives of the process.

Figure 14:
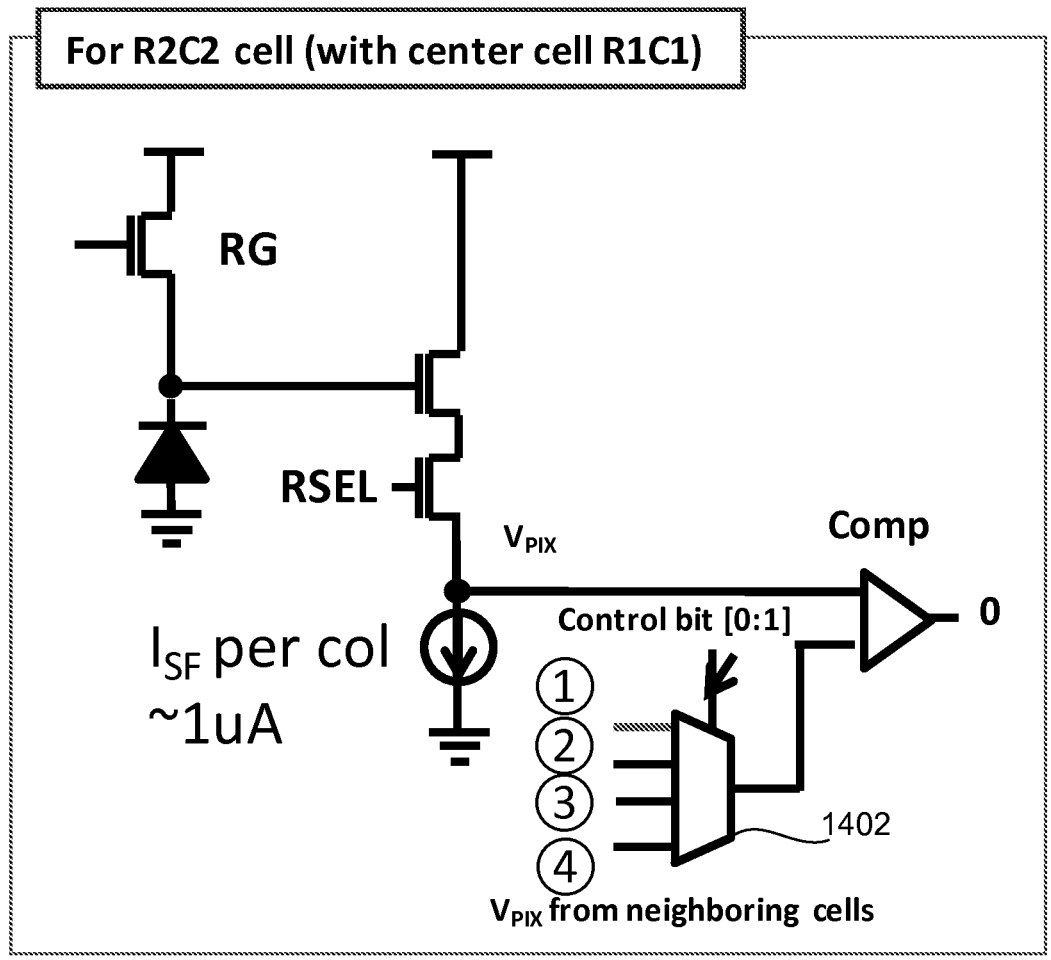
FIG. 14 illustrates an example in-pixel and/or peripheral circuitry for performing operations according to certain aspects of the disclosure.
Figure 15:
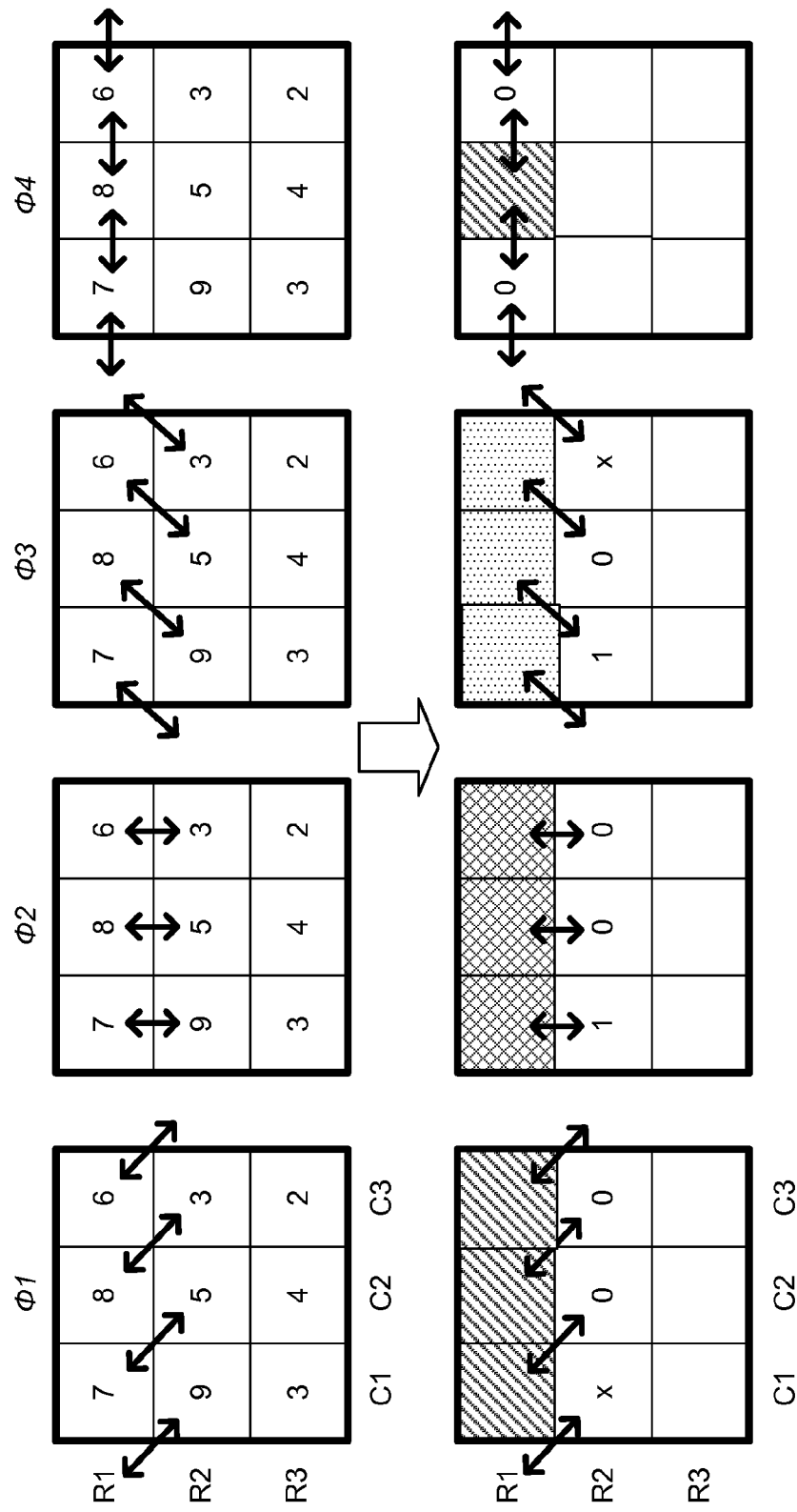
FIG. 15 illustrates example comparisons performed for a grid of nine sensor element readings at times $\varphi 1$, $\varphi 2$, $\varphi 3$ and $\varphi 4$.
Figure 17:
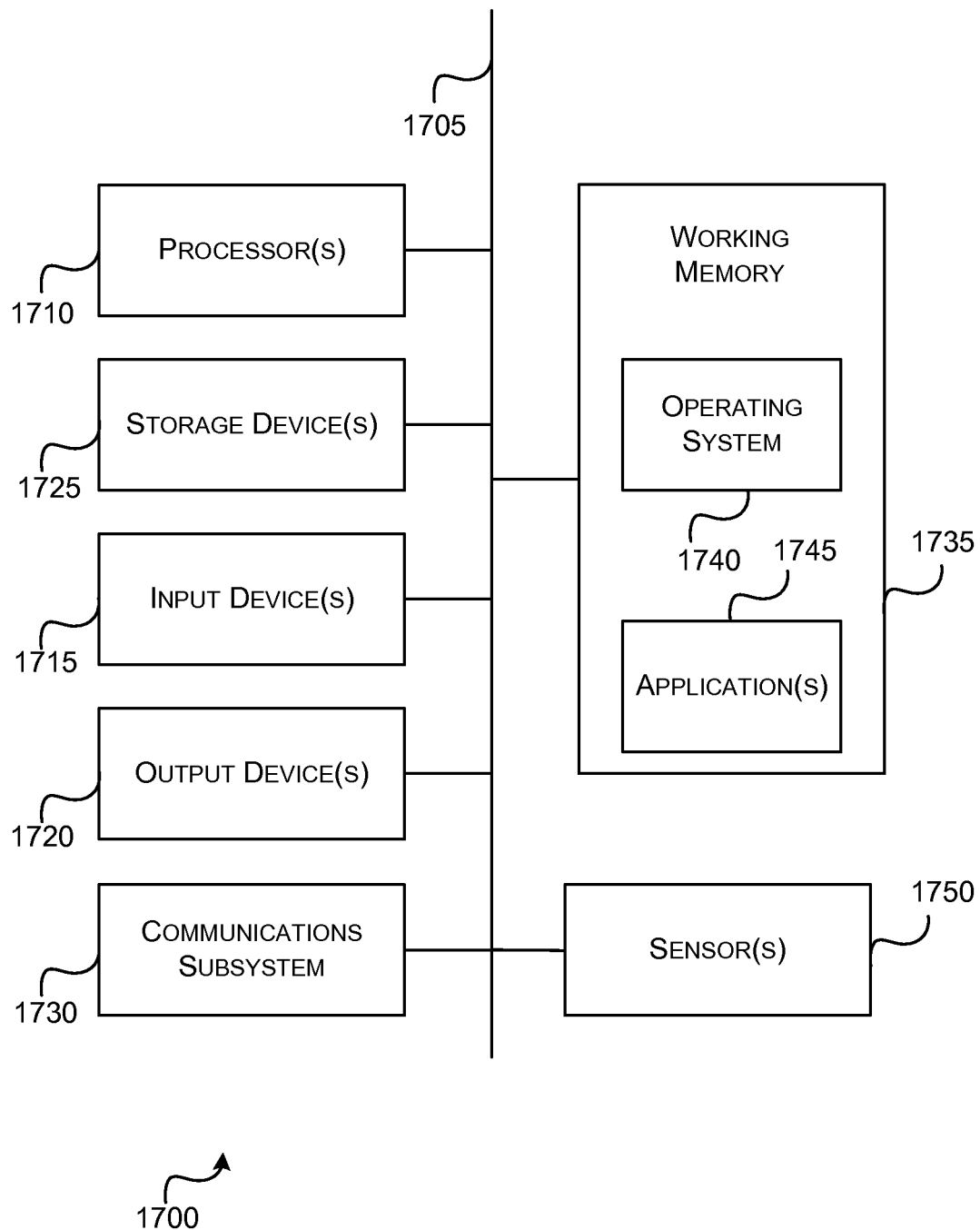
FIG. 17 illustrates an example of a computing device in which one or more embodiments may be implemented.

FIG. 14 illustrates an example in-pixel circuitry or peripheral circuitry for performing operations according to certain aspects of the disclosure. For example, the multiplexer shown in FIG. 9 may be configured to select values from four different neighboring sensor element readings, one at a time, to compare against the center sensor element reading, as previously described in FIGS. 10A-B and FIGS. 11A-H. An example implementation of a comparator ("comp") is shown in FIG. 17. Although FIG. 14 as illustrated provides an example for comparison in the analog domain, it is understood that comparisons between neighboring pixels may be done in the digital domain. In such an implementation, it is understood that the circuit shown in FIG. 14 may include analog-to-digital conversion circuitry (not shown). Furthermore, whether comparisons are done in the analog or digital domains, it is understood that in peripheral circuit implementations, circuits and/or functional blocks (not shown) may be inserted between $V_{px}$ and comparator Comp as well as between $V_{px}$ from neighboring cells and multiplexer 1402.

FIG. 15 illustrates example comparisons performed for a grid of nine sensor element readings at times, $\varphi 1$, $\varphi 2$, $\varphi 3$ and $\varphi 4$. In one illustration, the comparisons for several subject sensor elements may be performed in parallel, for example comparisons for all pixel elements in a given row can be compared in parallel such that all pixels in a given row are each, simultaneously, a subject sensor element. The top four grids of nine sensor element readings illustrate the sensor element values and the bottom four grids illustrate LBP threshold values for different subject sensor elements generated at each of the times, $\varphi 1$, $\varphi 2$, $\varphi 3$ and $\varphi 4$, where, in each of the times, each of a plurality of subject sensor elements are simultaneously compared to one (or in the case of $\varphi 4$, two) of its neighboring sensor elements. In FIG. 15, X is placed in pixels where the comparison value is unknown due to the comparison neighbor sensor element not being illustrated in the illustrated grid of nine sensor elements for simplicity. The double arrows in FIG. 15 illustrate that the comparisons are performed only once between any two sensor elements. A two's complement of the stored comparison is used depending on if the comparison is a currently computed comparison or a previously computed comparison.

As previously discussed in FIGS. 11A-11D, FIG. 15 further illustrates performing a reduced number of comparisons for generating the CV features within a reduced period of time. Using duplicated and parallel hardware several comparisons may be performed in parallel during the same clock periods. Therefore, multiple parallel computation structures can be configured to compare values associated with each of a plurality of subject sensor elements to values associated with a sensor element neighboring the each of the plurality of subject sensor elements, simultaneously, as explained below. For example, the comparisons for a subset of neighbors for all pixels in a whole row, such as R1 in FIG. 15, could be evaluated in a few cycles with the appropriate hardware. So taking, as an example, R1 as the row being currently evaluated, the comparisons between all pixels in R1 with all pixels situated in the row below, R2, but one column to the right (using row-column notation, that is to say values associated with sensor elements R1Cj are compared to values associated with sensor elements R2Cj+1, where, for the illustrated three by three grid, j=1, 2, and 3) can all be performed in a first clock cycle ($\varphi 1$); the comparisons between all sensor elements in R1 with all sensor elements situated in the row below, R2, but in the same column (that is to say values associated with sensor elements R1Cj are compared to values associated with sensor elements R2Cj) can all be performed in a second clock cycle ($\varphi 2$); and then the comparisons between all sensor elements in R1 with all sensor elements situated in the row below, but one column to the left (that is to say values associated with sensor elements R1Cj are compared to values associated sensor elements R2Cj−1) can all be performed at a third clock cycle ($\varphi 3$). Finally, in the fourth clock cycle ($\varphi 4$), the comparisons between pixels in R1 with neighboring pixels situated in the same row, R1, (that is to say values associated with sensor elements R1Cj are compared to values associated with sensor elements R1Cj−1 and R1Cj+1) can be performed. Therefore, in this example, within four cycles, evaluations of an entire row of subject sensor elements can be performed by comparing the sensor readings of all sensor elements in the row with sensor readings from each of a subset of a plurality of neighboring sensor elements to each of the sensor elements in the row. As shown, at $\varphi 1$, the LBP threshold value for comparing subject sensor element R1C1 to R2C2 is "0." Once R2C2 is the subject sensor element, for example when all pixels in row R2 are evaluated in a subsequent four cycles like those shown here, the comparison of R2C2 to R1C1 is not reproduced, and a binary compliment of "1" can be used as the threshold value without performing or computing the comparison again. Similarly, at $\varphi 1$, the LBP threshold value for comparing subject sensor element R1C2 to R2C3 is also "0," as shown. Once R2C3 is the subject sensor element, this comparison also is not repeated. Rather, these comparison results can be used as previously computed comparisons once LBP labels for subject sensor elements in row R2 are computed. At $\varphi 2$, the LBP threshold values for comparing subject sensor elements R1C1, R1C2, and R1C3 to their neighbors R2C1, R2C2, and R2C3, respectively, are all shown as "1," "0," and "0." At $\varphi 3$, the LBP threshold values for comparing subject sensor elements R1C2 and R1C3 to their neighbors R2C1 and R2C2, respectively, are shown as "1" and "0." Finally, at $\varphi 4$, LBP threshold values for comparing subject sensor element R1C2 to its two R1 neighbors, R1C1 and R1C3 are shown as "0." Taking R1C1 as the subject sensor element, the binary compliment, "1," can be used for the LBP threshold value comparing R1C1 to its R1 neighbor, R1C2 without performing another comparison. In this way, by $\varphi 4$, computation of an LBP label for all the sensor elements in R1 is now possible. For portions of the LBP label dependent on comparisons between sensor elements in row R1 and their neighbors in the row above, previously computed comparisons can be used that were performed when evaluating the previous row (taking the binary compliment where appropriate). Hence, in general, it could be said that an LBP label for all sensor elements in a row can be computed using previously computed comparisons from an evaluation of a previous row similar to the comparisons illustrated above at times $\varphi 1$, $\varphi 2$, and $\varphi 3$ along with the currently computed comparisons from the evaluation of the current row similar to the comparisons illustrated above at times $\varphi 1$, $\varphi 2$, $\varphi 3$, and $\varphi 4$.

Figure 16:
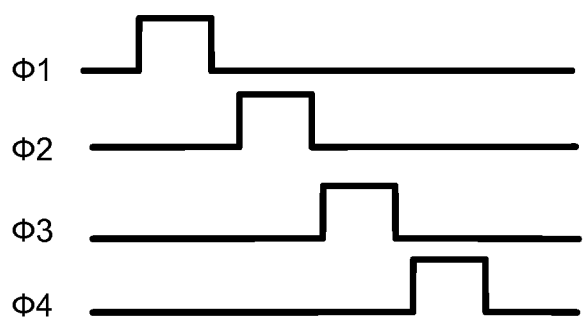
FIG. 16 represents four consecutive clock cycles—$\varphi 1$, $\varphi 2$, $\varphi 3$ and $\varphi 4$.

FIG. 16 represents the four consecutive clock cycles for $\varphi 1$, $\varphi 2$, $\varphi 3$ and $\varphi 4$. As shown in FIG. 15, in some instances, the comparisons for generating the threshold values based on comparisons with a subset of neighbors for any given row may be completed in four clock cycles. During each of the four clock cycles, cells in the entire row are compared per row simultaneously. For each read out, the threshold may be stored in temporary memory, such as static random-access memory (SRAM). In some implementations, reusing the value from SRAM may require calculating the Two's complement of the stored value and may require an additional clock cycle after $\varphi 4$.

According to one or more aspects, any and/or all of the methods and/or method steps described in FIGS. 1-16 herein may be implemented by and/or in sensor apparatus, such as a light sensor apparatus. In some embodiments, the sensor element array is a light sensor element array, and each of the sensor elements comprises a photo diode. In one embodiment, one or more of the method steps discussed may be implemented by a sensing element and processing logic of the sensor apparatus, such as in-pixel circuitry and/or peripheral circuitry. Additionally, or alternatively, any and/or all of the methods and/or method steps described herein may be implemented in computer-readable instructions, such as computer-readable instructions stored on a computer-readable medium, such as the memory, storage or another computer-readable medium.

FIG. 17 illustrates an example computing device incorporating parts of the device and sensor 100 employed in practicing embodiments of the invention. For example, computing device 1700 may represent some of the components of a mobile device or any other computing device. Examples of a computing device 1700 include, but are not limited to, desktops, workstations, personal computers, supercomputers, video game consoles, tablets, smart phones, laptops, netbooks, or other portable devices. FIG. 17 provides a schematic illustration of one embodiment of a computing device 1700 that may perform the methods provided by various other embodiments, as described herein, and/or may function as the host computing device, a remote kiosk/terminal, a point-of-sale device, a mobile multifunction device, a set-top box and/or a computing device. FIG. 17 is meant only to provide a generalized illustration of various components, any or all of which may be utilized as appropriate. FIG. 17, therefore, broadly illustrates how individual system elements may be implemented in a relatively separated or relatively more integrated manner.

The computing device 1700 is shown comprising hardware elements that may be electrically coupled via a bus 1705 (or may otherwise be in communication, as appropriate). The hardware elements may include one or more processors 1710, including, without limitation, one or more general-purpose processors and/or one or more special-purpose processors (such as digital signal processing chips, graphics acceleration processors, and/or the like); one or more input devices 1715, which may include, without limitation, one or more camera sensors 1750, a mouse, a keyboard and/or the like; and one or more output devices 1720, which may include, without limitation, a display unit, a printer and/or the like. Sensors 1750 module may include light sensors, olfactory sensors and/or chemical sensors. An example sensor 100 is described in FIG. 1. In certain aspects, frame-based and/or event-based sensors may be incorporated into the computing device 1700. Aspects of the disclosure, provide methods for efficiently computing computer vision features using these sensors 1750.

The computing device 1700 may further include (and/or be in communication with) one or more non-transitory storage device(s) 1725, which may comprise, without limitation, local and/or network accessible storage, and/or may include, without limitation, a disk drive, a drive array, an optical storage device, a solid-form storage device, such as a random access memory ("RAM") and/or a read-only memory ("ROM"), which may be programmable, flash-updateable and/or the like. Such storage devices may be configured to implement any appropriate data storage, including, without limitation, various file systems, database structures, and/or the like.

The computing device 1700 might also include a communications subsystem 1730. The communications subsystem 1730 may include a transceiver for receiving and transmitting data or a wired and/or wireless medium. The communications subsystem 1730 may also include, without limitation, a modem, a network card (wireless or wired), an infrared communication device, a wireless communication device and/or chipset (such as a Bluetooth™ device, an 802.11 device, a WiFi device, a WiMax device, cellular communication facilities, etc.), and/or the like. The communications subsystem 1730 may permit data to be exchanged with a network (such as the network described below, to name one example), other computing devices, and/or any other devices described herein. In many embodiments, the computing device 1700 will further comprise a non-transitory working memory 1735, which may include a RAM or ROM device, as described above.

The computing device 1700 may comprise software elements, shown as being currently located within the working memory 1735, including an operating system 1740, device drivers, executable libraries, and/or other code, such as one or more application programs 1745, which may comprise computer programs provided by various embodiments, and/or may be designed to implement methods, and/or configure systems, provided by other embodiments, as described herein. Merely by way of example, one or more procedures described with respect to the method(s) discussed above might be implemented as code and/or instructions executable by a computer (and/or a processor within a computer); in an aspect, then, such code and/or instructions may be used to configure and/or adapt a general purpose computer (or other device) to perform one or more operations in accordance with the described methods.

A set of these instructions and/or code might be stored on a computer-readable storage medium, such as the storage device(s) 1725 described above. In some cases, the storage medium might be incorporated within a computing device, such as computing device 1700. In other embodiments, the storage medium might be separate from a computing device (e.g., a removable medium, such as a compact disc), and/or provided in an installation package, such that the storage medium may be used to program, configure and/or adapt a general purpose computer with the instructions/code stored thereon. These instructions might take the form of executable code, which is executable by the computing device 1700 and/or might take the form of source and/or installable code, which, upon compilation and/or installation on the computing device 1700 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

Some embodiments may employ a computing device (such as the computing device 1700) to perform methods in accordance with the disclosure. For example, some or all of the procedures of the described methods may be performed by the computing device 1700 in response to processor(s) 1710 executing one or more sequences of one or more instructions (which might be incorporated into the operating system 1740 and/or other code, such as one or more application programs 1745) contained in the working memory 1735. Such instructions may be read into the working memory 1735 from another computer-readable medium, such as one or more of the storage device(s) 1725. Merely by way of example, execution of the sequences of instructions contained in the working memory 1735 might cause the processor(s) 1710 to perform one or more procedures of the methods described herein.

The terms "machine-readable medium" and "computer-readable medium," as used herein, refer to any medium that participates in providing data that causes a machine to operate in a specific fashion. In an embodiment implemented using the computing device 1700, various computer-readable media might be involved in providing instructions/code to processor(s) 1710 for execution and/or might be used to store and/or carry such instructions/code (e.g., as signals). In many implementations, a computer-readable medium is a physical and/or tangible storage medium. Such a medium may take many forms, including, but not limited to, non-volatile media, volatile media, and transmission media. Non-volatile media include, for example, optical and/or magnetic disks, such as the storage device(s) 1725. Volatile media include, without limitation, dynamic memory, such as the working memory 1735. Transmission media include, without limitation, coaxial cables, copper wire and fiber optics, including the wires that comprise the bus 1705, as well as the various components of the communications subsystem 1730 (and/or the media by which the communications subsystem 1730 provides communication with other devices). Hence, transmission media may also take the form of waves (including, without limitation, radio, acoustic and/or light waves, such as those generated during radio-wave and infrared data communications). In an alternate embodiment, event-driven components and devices, such as cameras, may be used, where some of the processing may be performed in analog domain.

Common forms of physical and/or tangible computer-readable media include, for example, a floppy disk, a flexible disk, hard disk, magnetic tape, or any other magnetic medium, a Compact Disc-Read Only Memory (CD-ROM), any other optical medium, punchcards, papertape, any other physical medium with patterns of holes, a Random Access Memory (RAM), a Programmable Read Only Memory (PROM), Erasable Programmable-Read Only Memory (EPROM), a FLASH-EPROM, any other memory chip or cartridge, a carrier wave as described hereinafter, or any other medium from which a computer may read instructions and/or code.

Various forms of computer-readable media may be involved in carrying one or more sequences of one or more instructions to the processor(s) 1710 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computing device 1700. These signals, which might be in the form of electromagnetic signals, acoustic signals, optical signals and/or the like, are all examples of carrier waves on which instructions may be encoded, in accordance with various embodiments of the invention.

The communications subsystem 1730 (and/or components thereof) generally will receive the signals, and the bus 1705 then might carry the signals (and/or the data, instructions, etc., carried by the signals) to the working memory 1735, from which the processor(s) 1710 retrieves and executes the instructions. The instructions received by the working memory 1735 may optionally be stored on non-transitory storage device(s) 1725 either before or after execution by the processor(s) 1710.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

Having described several embodiments, various modifications, alternative constructions, and equivalents may be used without departing from the spirit of the disclosure. For example, the above elements may merely be a component of a larger system, wherein other rules may take precedence over or otherwise modify the application of the invention. Also, a number of steps may be undertaken before, during, or after the above elements are considered. Accordingly, the above description does not limit the scope of the disclosure.

What is claimed is:

1. An apparatus for generating computed results based on sensor readings, the apparatus comprising:

a sensor element array comprising a plurality of sensor elements, the plurality of sensor elements arranged along at least a first dimension and a second dimension of the sensor element array, each of the plurality of sensor elements capable of generating a sensor reading based on light incident upon the sensor element;

a memory;

at least one computation structure configured to generate a computer vision (CV) label for a subject sensor element from the plurality of sensor elements, by, when generating the CV label for the subject sensor element,
only performing comparisons of the sensor reading for the subject sensor element with the sensor reading of each of a subset of a plurality of neighboring sensor elements to the subject sensor element, the plurality of neighboring sensor elements being adjacent to the subject sensor element, and
retrieving from the memory previously performed comparisons of the sensor reading for the subject sensor element with the sensor reading of each of remaining neighboring sensor elements to the subject sensor element, wherein the previously performed comparisons were performed when generating the CV label for sensor elements other than the subject sensor element and wherein the comparisons from the subset of the plurality of neighboring sensor elements and the comparisons from the remaining neighboring sensor elements are together required for generating the CV label for the subject sensor element and wherein the subset is smaller than the plurality of neighboring sensor elements.

2. The apparatus of claim 1, wherein the CV label for the subject sensor element is a local binary pattern (LBP) label.

3. The apparatus of claim 2, wherein the comparisons from the subset of the plurality of neighboring sensor elements and the comparisons from the remaining neighboring sensor elements comprise eight computed comparisons required for generating the LBP label.

4. The apparatus of claim 3, wherein the previously performed comparisons performed when generating the CV label for a sensor element other than the subject sensor element comprise at least four comparisons computed while generating LBP labels for the sensor elements other than the subject sensor element.

5. The apparatus of claim 1, wherein the plurality of neighboring sensor elements to the subject sensor element are immediately adjacent sensor elements to the subject sensor element.

6. The apparatus of claim 1, wherein the sensor element array comprises an array of pixels wherein each pixel comprises the sensor element and in-pixel circuitry, and the at least one computation structure is part of in-pixel circuitry coupled to the sensor element.

7. The apparatus of claim 1, wherein the at least one computation structure is part of peripheral circuitry coupled to the sensor element array and configured to receive output from the plurality of sensor elements including the subject sensor element and the plurality of neighboring sensor elements.

8. The apparatus of claim 1, wherein the computation structure comprises one or more comparators configured to:
perform the comparisons of the sensor reading for the subject sensor element with the sensor readings of each of the subset of the plurality of neighboring sensor elements to determine threshold values for the respective neighboring sensor elements with respect to the subject sensor element; and retrieve from the memory the threshold values generated for the remaining neighboring sensor elements from the previously performed comparisons of the sensor reading for the subject sensor element with the sensor reading of each of the remaining neighboring sensor elements to the subject sensor element.

9. The apparatus of claim 8, wherein a binary complement for the retrieved threshold values for the remaining neighboring sensor elements of the plurality of the neighboring sensor elements is used for generating the CV label.

10. The apparatus of claim 1, wherein the sensor element array is a vision sensor, and each of the sensor elements comprises a photodiode.

11. The apparatus of claim 1, wherein the at least one computation structure comprises multiple parallel computation structures configured to compare the sensor reading for each of a plurality of subject sensor elements to a sensor element neighboring the each of the plurality of subject sensor elements simultaneously.

12. The apparatus of claim 1, wherein the CV label for the subject sensor element is generated for detecting features for a CV application.

13. The apparatus of claim 1, wherein the at least one computation structure is a digital computation structure.

14. A method for generating computed results based on sensor readings, comprising:
receiving a sensor reading based on light incident upon a subject sensor element from a plurality of sensor elements forming a sensor element array, wherein the plurality of sensor elements are arranged along at least a first dimension and a second dimension of the sensor element array;
performing comparisons, at a computation structure, of the sensor reading for the subject sensor element with the sensor reading of each of only a subset of a plurality of neighboring sensor elements to the subject sensor element to generate currently performed comparisons, the plurality of neighboring sensor elements being adjacent to the subject sensor element and the subset being smaller than the plurality of neighboring sensor elements;
retrieving, from one or more buffers, previously performed comparisons of the sensor reading for the subject sensor element with the sensor reading of each of remaining neighboring sensor elements to the subject sensor element, wherein the previously performed comparisons were performed when generating the CV label for sensor elements other than the subject sensor element and wherein the comparisons from the subset of the plurality of neighboring sensor elements and the comparisons from the remaining neighboring sensor elements are together required for generating the CV label for the subject sensor element; and
generating, at the computation structure, the CV label for the subject sensor element by using the currently performed comparisons and the previously performed comparisons.

15. The method of claim 14, wherein the CV label for the subject sensor element is a local binary pattern (LBP) label.

16. The method of claim 15, wherein the comparisons from the subset of the plurality of neighboring sensor elements and the comparisons from the remaining neighboring sensor elements comprise eight computed comparisons required for generating the LBP label.

17. The method of claim 16, wherein the previously performed comparisons performed when generating the CV label for a sensor element other than the subject sensor element comprise at least four comparisons computed while generating LBP labels for the sensor elements other than the subject sensor element.

18. The method of claim 14, wherein the plurality of neighboring sensor elements to the subject sensor element are immediately adjacent sensor elements to the subject sensor element.

19. The method of claim 14, wherein the sensor element array comprises an array of pixels, wherein each pixel comprises the sensor element and in-pixel circuitry, and the computation structure is part of the in-pixel circuitry coupled to the sensor element.

20. The method of claim 14, wherein the computation structure is part of peripheral circuitry coupled to the sensor element array.

21. The method of claim 14, wherein the sensor element array is a vision sensor, and each of the plurality of sensor elements comprises a photodiode.

22. The method of claim 14, wherein performing comparisons, at the computation structure, of the sensor reading for the subject sensor element with the sensor reading of each of only the subset of the plurality of neighboring sensor elements comprises comparing, at a parallel computation structure, the sensor reading for each of a plurality of subject sensor elements to a sensor element neighboring the each of the plurality of subject sensor elements simultaneously.

23. The method of claim 14, wherein CV labels for each of the plurality of sensor elements are generated for detecting features for a CV application.

24. The method of claim 14, wherein the at least one computation structure is a digital computation structure.

25. An apparatus for generating computed results based on sensor readings comprising:
means for receiving a sensor reading based on light incident upon a subject sensor element from a plurality of sensor elements forming a sensor element array, wherein the plurality of sensor elements are arranged along at least a first dimension and a second dimension of the sensor element array;
means for performing comparisons of the sensor reading for the subject sensor element with the sensor reading of each of only a subset of a plurality of neighboring sensor elements to generate currently performed comparisons, the plurality of neighboring sensor elements being adjacent to the subject sensor element and the subset being smaller than the plurality of neighboring sensor elements;
means for retrieving previously performed comparisons of the sensor reading for the subject sensor element with the sensor reading of each of remaining neighboring sensor elements to the subject sensor element, wherein the previously performed comparisons were performed when generating the CV label for sensor elements other than the subject sensor element and wherein the comparisons from the subset of the plurality of neighboring sensor elements and the comparisons from the remaining neighboring sensor elements are together required for generating the CV label for the subject sensor element;
means for generating the CV label for the subject sensor element by using the currently performed comparisons and the previously performed comparisons.

26. The apparatus of claim 25, wherein the CV label for the subject sensor element is a local binary pattern (LBP) label.

27. The apparatus of claim 26, wherein the comparisons from the subset of the plurality of neighboring sensor elements and the comparisons from the remaining neighboring sensor elements comprise eight computed comparisons required for generating the LBP label.

28. The apparatus of claim 25, wherein the plurality of neighboring sensor elements to the subject sensor element are immediately adjacent sensor elements to the subject sensor element.

29. A non-transitory computer-readable storage medium, wherein the non-transitory computer-readable storage medium comprises instructions executable by a processor for:
   receiving a sensor reading based on light incident upon a subject sensor element from a plurality of sensor elements forming a sensor element array, wherein the plurality of sensor elements are arranged along at least a first dimension and a second dimension of the sensor element array;
   receiving comparisons of the sensor reading for the subject sensor element with the sensor reading of each of only a subset of a plurality of neighboring sensor elements to generate currently performed comparisons, the plurality of neighboring sensor elements being adjacent to the subject sensor element and the subset being smaller than the plurality of neighboring sensor elements;
   retrieving previously performed comparisons of the sensor reading for the subject sensor element with the sensor reading of each of remaining neighboring sensor elements to the subject sensor element, wherein the previously performed comparisons were performed when generating the CV label for sensor elements other than the subject sensor element and wherein the comparisons from the subset of the plurality of neighboring sensor elements and the comparisons from the remaining neighboring sensor elements are together required for generating the CV label for the subject sensor element;
   generating the CV label for the subject sensor element by using the currently performed comparisons and the previously performed comparisons.

30. The non-transitory computer-readable storage medium of claim 29, wherein the CV label for the subject sensor element is a local binary pattern (LBP) label.

* * * * *